(12) United States Patent
Shi et al.

(10) Patent No.: US 12,727,300 B2
(45) Date of Patent: Sep. 1, 2026

(54) LIGHT-EMITTING SUBSTRATE HAVING IMPROVED LUMINOUS EFFICACY AND LUMINOUS EFFECT AND MANUFACTURING METHOD THEREOF, AND LIGHT-EMITTING APPARATUS

(71) Applicant: BOE TECHNOLOGY GROUP CO., LTD., Beijing (CN)

(72) Inventors: Ge Shi, Beijing (CN); Song Yang, Beijing (CN); Pengxia Liang, Beijing (CN); Xiaochuan Chen, Beijing (CN); Xue Dong, Beijing (CN); Yanliu Sun, Beijing (CN); Zheng Fang, Beijing (CN); Yujie Liu, Beijing (CN); Jiahui Han, Beijing (CN); Qian Wu, Beijing (CN); Hongpeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 868 days.

(21) Appl. No.: 17/914,808

(22) PCT Filed: Oct. 28, 2021

(86) PCT No.: PCT/CN2021/127200
§ 371 (c)(1),
(2) Date: Sep. 27, 2022

(87) PCT Pub. No.: WO2023/070478
PCT Pub. Date: May 4, 2023

(65) Prior Publication Data

US 2024/0322092 A1 Sep. 26, 2024

(51) Int. Cl.
*H10H 20/855* (2025.01)
*H10H 20/814* (2025.01)
(Continued)

(52) U.S. Cl.
CPC ........ *H10H 20/855* (2025.01); *H10H 20/814* (2025.01); *H10H 20/84* (2025.01);
(Continued)

(58) Field of Classification Search
CPC . H01L 25/0753; H01L 25/167; H10H 29/142; H10H 20/855; H10H 20/0361; G02B 5/18
(Continued)

(56) References Cited

U.S. PATENT DOCUMENTS

2008/0303044 A1* 12/2008 Kohno ................. H10H 20/854 257/E33.061
2018/0149792 A1* 5/2018 Lee ...................... G02B 6/0035
(Continued)

FOREIGN PATENT DOCUMENTS

WO WO-2019134562 A1 * 7/2019 ....... G02F 1/133615

OTHER PUBLICATIONS

Away. (n.d.) Collins English Dictionary—Complete and Unabridged, 12th Edition 2014. (1991, 1994, 1998, 2000, 2003, 2006, 2007, 2009, 2011, 2014). Retrieved Feb. 20, 2026 from https://www.thefreedictionary.com/away (Year: 2014).*
(Continued)

*Primary Examiner* — Ratisha Mehta
*Assistant Examiner* — Mikka Liu
(74) *Attorney, Agent, or Firm* — XSENSUS LLP

(57) ABSTRACT

A light-emitting substrate includes a pixel layer including a plurality of sub-pixels. Each sub-pixel includes a light-emitting element, a first light extraction layer, a first material layer, and a second material layer. The light-emitting element is configured to emit light of a first color. The first light extraction layer is configured to deflect the light emitted from the light-emitting element into the first material layer at a preset angle. The first material layer and the second material layer are configured to enable the light deflected at
(Continued)

the preset angle to propagate in the first material layer and the second material layer. The plurality of sub-pixels include at least one first sub-pixel. Of a first material layer and a second material layer included in the at least one first sub-pixel, at least the second material layer includes a first light conversion material.

19 Claims, 11 Drawing Sheets

(51) Int. Cl.

| | |
|---|---|
| ***H10H 20/84*** | (2025.01) |
| ***H10H 20/851*** | (2025.01) |
| ***H10H 29/14*** | (2025.01) |
| ***H10W 90/00*** | (2026.01) |
| *H10H 20/01* | (2025.01) |

(52) U.S. Cl.

CPC ...... *H10H 20/8513* (2025.01); *H10H 29/142* (2025.01); *H10W 90/00* (2026.01); *H10H 20/0361* (2025.01); *H10H 20/0363* (2025.01)

(58) Field of Classification Search

USPC ........................................ 257/79, 88–89, 98

See application file for complete search history.

(56) References Cited

U.S. PATENT DOCUMENTS

| | | | | |
|---|---|---|---|---|
| 2019/0094445 | A1* | 3/2019 | Meng | G02B 6/0091 |
| 2023/0238491 | A1* | 7/2023 | Kwak | H10D 86/451 257/79 |
| 2024/0049552 | A1* | 2/2024 | Kim | H10K 59/122 |

OTHER PUBLICATIONS

Contact. (n.d.) Merriam-Webster Dictionary. Retrieved Feb. 20, 2026 from https://www.merriam-webster.com/dictionary/contact (Year: NA).*

* cited by examiner

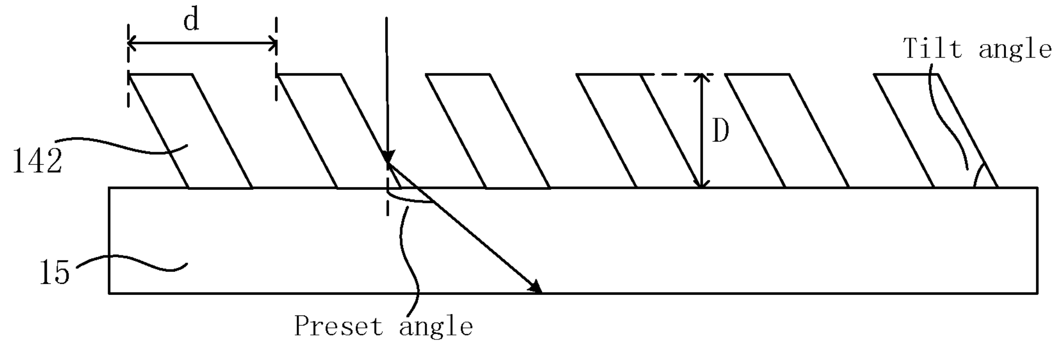
FIG. 1M
d
142
Blaze angle
15
Preset angle
FIG. 1N
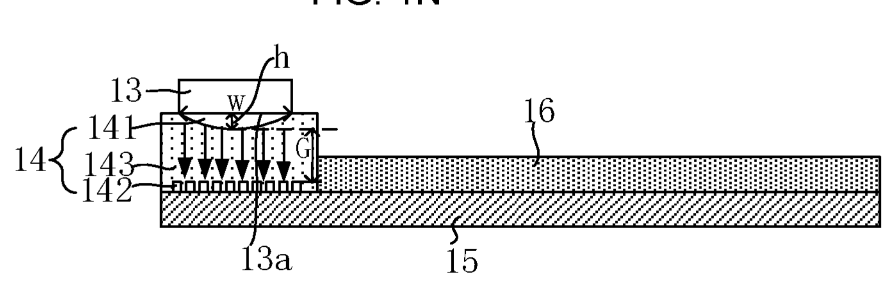
FIG. 1O

LIGHT-EMITTING SUBSTRATE HAVING IMPROVED LUMINOUS EFFICACY AND LUMINOUS EFFECT AND MANUFACTURING METHOD THEREOF, AND LIGHT-EMITTING APPARATUS

CROSS-REFERENCE TO RELATED APPLICATION

This application is a national phase entry under 35 USC 371 of International Patent Application No. PCT/CN 2021/127200 filed on Oct. 28, 2021, which is incorporated herein by reference in its entirety.

TECHNICAL FIELD

The present disclosure relates to the field of lighting and display technologies, and in particular, to a light-emitting substrate and a manufacturing method thereof, and a light-emitting apparatus.

BACKGROUND

In self-luminous devices, quantum dot light-emitting diode (QLED) light-emitting devices have received widespread attention due to the advantages of higher theoretical luminous efficiency, adjustable color, wider color gamut, better color saturation and vividness, and lower energy costs.

SUMMARY

In an aspect, a light-emitting substrate is provided. The light-emitting substrate includes a pixel layer including a plurality of sub-pixels. Each sub-pixel includes a light-emitting element, a first light extraction layer disposed on a side of the light-emitting element where a light exit surface of the light-emitting element is located, a first material layer disposed on a side of the first light extraction layer where a first surface of the first light extraction layer is located, and a second material layer that is in contact with a surface of the first material layer opposite to a second surface of the first material layer. The light-emitting element is configured to emit light of a first color. The first light extraction layer is configured to deflect the light emitted from the light-emitting element into the first material layer at a preset angle. The first material layer and the second material layer are configured to enable the light deflected at the preset angle to propagate in the first material layer and the second material layer. The first surface is a surface of the first light extraction layer away from the light-emitting element. The second surface is a surface of the first material layer proximate to or away from the light-emitting element. The plurality of sub-pixels include at least one first sub-pixel. Of a first material layer and a second material layer included in a first reference sub-pixel, at least the second material layer includes a first light conversion material. The first light conversion material is configured to absorb light propagating in the first material layer and the second material layer included in the first reference sub-pixel, and to convert the absorbed light into emergent light of a second color. The first reference sub-pixel is a first sub-pixel from the at least one first sub-pixel.

In some embodiments, in each sub-pixel, in a case where the second surface is the surface of the first material layer away from the light-emitting element, an area of an orthographic projection of the first material layer on a plane where the pixel layer is located is greater than an area of an orthographic projection of the first light extraction layer on the plane where the pixel layer is located, and the second material layer is disposed on a portion, beyond a region where the first light extraction layer is located, of the surface of the first material layer facing the light-emitting element. In each sub-pixel, in a case where the second surface is the surface of the first material layer proximate to the light-emitting element, the area of the orthographic projection of the first material layer on the plane where the pixel layer is located is greater than or equal to the area of the orthographic projection of the first light extraction layer on the plane where the pixel layer is located, and the second material layer is disposed on the surface of the first material layer away from the light-emitting element.

In some embodiments, the light-emitting substrate further includes a substrate. In each sub-pixel, the substrate serves as the first material layer; or the second surface is the surface of the first material layer away from the light-emitting element, and the substrate is disposed on a side of the first material layer away from the light-emitting element, and is in contact with the first material layer.

In some embodiments, in each sub-pixel, the second surface and a third surface are configured to reflect reference light, so that the light deflected into the first material layer at the preset angle propagates in the first material layer and the second material layer; and the third surface is a surface of the second material layer away from the first material layer, and the reference light is light deflected into the first material layer at the preset angle and entering the first material layer and the second material layer during propagation.

In some embodiments, the plurality of sub-pixels further include at least one second sub-pixel. Of a first material layer and a second material layer included in a second reference sub-pixel, at least the second material layer includes a second light conversion material. The second light conversion material is configured to absorb light propagating in the first material layer and the second material layer included in the second reference sub-pixel, and to convert the absorbed light into emergent light of a third color, and the second reference sub-pixel is a second sub-pixel from the at least one second sub-pixel. Alternatively, of a first material layer and a second material layer included in a second sub-pixel, at least the second material layer includes first scattering particles. The first scattering particles are configured to scatter light propagating in the first material layer and the second material layer included in the second reference sub-pixel, and the second reference sub-pixel is another second sub-pixel from the at least one second sub-pixel. The light-emitting substrate has a plurality of pixel regions. The plurality of sub-pixels constitute at least one sub-pixel group, and a sub-pixel group in the at least one sub-pixel group is located in a pixel region in the plurality of pixel regions. The sub-pixel group includes sub-pixels, and the sub-pixels included in the sub-pixel group include at least one first sub-pixel and at least one second sub-pixel. In the sub-pixel group, light-emitting elements included in the sub-pixels are first light-emitting diodes, and have a same light-emitting color. The first light-emitting diodes include a first electrode, second electrodes, and a semiconductor layer disposed between the first electrode and the second electrodes. The light-emitting elements included in the sub-pixels share the same first electrode.

In some embodiments, the first light-emitting diodes are vertical light-emitting diodes, and the first electrode is closer to the first material layer in each sub-pixel than the second electrodes.

In some embodiments, in the sub-pixel group, an area of an orthographic projection of a first material layer included in each of the sub-pixels on a plane where the pixel layer is located is greater than an area of an orthographic projection of a first light extraction layer included in this sub-pixel on the plane where the pixel layer is located, and portions, beyond a region where first light extraction layers included in the sub-pixels are located, of orthographic projections of first material layers included in the sub-pixels on the plane where the pixel layer is located surround a region where the light-emitting elements included in the sub-pixels are located.

In some embodiments, the first light-emitting diodes further include a reflective layer disposed on a side of the first light-emitting diodes away from light exit surfaces of the first light-emitting diodes and covering at least a region where the light exit surfaces are located.

In some embodiments, the sub-pixel group further includes at least one third sub-pixel. Of a first material layer and a second material layer included in a third reference sub-pixel, at least the second material layer includes a third light conversion material. The third light conversion material is configured to absorb light propagating in the first material layer and the second material layer included in the third reference sub-pixel, and to convert the absorbed light into emergent light of a fourth color, and the third reference sub-pixel is a third sub-pixel from the at least one third sub-pixel. Alternatively, of a first material layer and a second material layer included in a third reference sub-pixel, at least the second material layer includes second scattering particles. The second scattering particles are configured to scatter light propagating in the first material layer and the second material layer included in the third reference sub-pixel, and the third reference sub-pixel is another third sub-pixel from the at least one third sub-pixel. The second color, the third color and the fourth color are three primary colors, respectively; or the second color, the first color and the fourth color are three primary colors, respectively; or the second color, the third color and the first color are three primary colors, respectively.

In some embodiments, in the sub-pixel group, the at least one first sub-pixel is a red sub-pixel, the at least one second sub-pixel is a green sub-pixel, and the at least one third sub-pixel is a blue sub-pixel. In the sub-pixel group, an area of the at least one first sub-pixel and an area of the at least one third sub-pixel are each less than an area of the at least one second sub-pixel, and the area of the at least one first sub-pixel is substantially equivalent to the area of the at least one third sub-pixel. Alternatively, in the sub-pixel group, the at least one first sub-pixel is a red sub-pixel, the at least one second sub-pixel is a blue sub-pixel, and the at least one third sub-pixel is a green sub-pixel. The area of the at least one first sub-pixel and the area of the at least one second sub-pixel are each less than the area of the at least one third sub-pixel, and the area of the at least one first sub-pixel is substantially equivalent to the area of the at least one second sub-pixel.

In some embodiments, in the sub-pixel group, a single red sub-pixel and a single blue sub-pixel exist, and a number of green sub-pixels is two. Areas of the red sub-pixel, the blue sub-pixel and a green sub-pixel in the two green sub-pixels are equal. The sub-pixels included in the sub-pixel group are arranged in an array.

In some embodiments, in the sub-pixel group, the two green sub-pixels are located in different rows and columns.

In some embodiments, the light-emitting substrate further includes black matrixes disposed between the plurality of sub-pixels. In a case where the substrate serves as the first material layer in each sub-pixel, at least part of the black matrixes are arranged in a same layer as second material layers in the plurality of sub-pixels, and are each in contact with second material layers included in two adjacent sub-pixels. In a case where the substrate is disposed on the side of the first material layer in each sub-pixel away from the light-emitting element, at least part of the black matrixes are arranged in a same layer as an entirety of first material layers 15 and the second material layers 16 in the plurality of sub-pixels, and are each in contact with second material layers and first material layers included in two adjacent sub-pixels.

In some embodiments, in the case where the substrate serves as the first material layer in each sub-pixel, the light-emitting substrate further includes a second light extraction layer and a light absorption pattern. The second light extraction layer and the light absorption pattern are respectively disposed at positions corresponding to a reference pattern in reference patterns, and are located on a side of the first material layer in each sub-pixel away from the reference pattern. The second light extraction layer is configured to extract light propagating in the first material layers and the second material layers in the plurality of sub-pixels in a form of total reflection toward a side of the second light extraction layer away from the first material layer in each sub-pixel. The light absorption pattern is disposed on a side of the second light extraction layer away from the first material layer in each sub-pixel, and is in contact with the second light extraction layer. The reference patterns are the at least part of the black matrixes arranged in the same layer as the second material layers in the plurality of sub-pixels.

In some embodiments, in a case where the second surface is the surface of the first material layer in each sub-pixel away from the light-emitting element, and in the sub-pixel group, portions, beyond a region where first light extraction layers included in the sub-pixels are located, of orthographic projections of first material layers included in the sub-pixels on a plane where the pixel layer is located surround a region where the light-emitting elements included in the sub-pixels are located, pixel driving circuits are further disposed on the substrate. Part of the black matrixes located between two adjacent sub-pixel groups are arranged in a same layer as first material layers or second material layers in the plurality of sub-pixels, or are arranged in a same layer as an entirety of the first material layers and the second material layers. The remaining part of the black matrixes include: a first portion located between first material layers or second material layers included in two adjacent sub-pixels in a same sub-pixel group, or located between an entirety of a first material layer and a second material layer included in a sub-pixel of the two adjacent sub-pixels and an entirety of a first material layer and a second material layer included in another sub-pixel of the two adjacent sub-pixels; and a second portion located on circuit wirings between light-emitting elements and pixel driving circuits included in the two adjacent sub-pixels in the same sub-pixel group.

In some embodiments, the second portion is disposed on a side of the light-emitting element away from the first material layer in each sub-pixel.

In some embodiments, the first light extraction layer includes a lens structure and a grating structure disposed on a side of the lens structure away from the light-emitting element, and a surface of the grating structure away from the light-emitting element is the first surface. The lens structure is configured to collimate the light emitted from the light-emitting element. The grating structure is configured to deflect light emitted from the lens structure, so as to deflect the light emitted from the light-emitting element into the first material layer in each sub-pixel at the preset angle.

In some embodiments, a refractive index of the lens structure is in a range of 1.2 to 1.4, inclusive, and an arch height of the lens structure is ⅓ times an aperture of the lens structure. A distance between the lens structure and the grating structure is greater than or equal to 0 nm and less than or equal to 200 nm.

In some embodiments, a duty cycle of the grating structure is in a range of 0.4 to 0.6, inclusive.

In some embodiments, the grating structure is a zero-order eliminating grating, a tilted grating or a blazed grating.

In some embodiments, in a case where the grating structure is the zero-order eliminating grating, the grating structure has a grating constant of 410 nm and a thickness of 280 nm. In a case where the grating structure is the tilted grating, the grating structure has a grating constant of 410 nm, a thickness of 450 nm and a tilt angle of 20 degrees. In a case where the grating structure is the blazed grating, the grating structure has a grating constant of 480 nm and a blaze angle of 35 degrees.

In some embodiments, the first light extraction layer further includes a transparent material layer filled between the grating structure and the lens structure. A refractive index of the transparent material layer is in a range of 1.2 to 1.3, inclusive.

In some embodiments, the light-emitting substrate further includes a filter film disposed on a side of the second material layer in each sub-pixel facing the second surface, and/or an antireflection film disposed on the side of the second material layer in each sub-pixel facing the second surface. The filter film includes filter units each disposed in a sub-pixel. A filter unit in the filter units is configured to allow light with a first wavelength to pass therethrough, and to absorb light with a second wavelength. The light with the first wavelength is light emitted from a sub-pixel where the filter unit is located, and the light with the second wavelength is light with other bands except the first wavelength in visible light bands.

In another aspect, a light-emitting apparatus is provided. The light-emitting apparatus includes the light-emitting substrate as described above.

In yet another aspect, a manufacturing method of a light-emitting substrate is provided. The manufacturing method includes a following step.

A pixel layer is formed. The pixel layer includes a plurality of sub-pixels.

Each sub-pixel includes a light-emitting element, a first light extraction layer disposed on a side of the light-emitting element where a light exit surface of the light-emitting element is located, a first material layer disposed on a side of the first light extraction layer where a first surface of the first light extraction layer is located, and a second material layer that is in contact with a surface of the first material layer opposite to a second surface of the first material layer. The light-emitting element is configured to emit light of a first color. The first light extraction layer is configured to deflect the light emitted from the light-emitting element into the first material layer at a preset angle. The first material layer and the second material layer are configured to enable the light deflected at the preset angle to propagate in the first material layer and the second material layer. The first surface is a surface of the first light extraction layer away from the light-emitting element. The second surface is a surface of the first material layer proximate to or away from the light-emitting element. The plurality of sub-pixels include at least one first sub-pixel. Of a first material layer and a second material layer included in the at least one first sub-pixel, at least the second material layer includes a first light conversion material. The first light conversion material is configured to absorb light propagating in a first material layer and a second material layer included in a first reference sub-pixel, and to convert the absorbed light into emergent light of a second color. The first reference sub-pixel is a first sub-pixel to which the first light conversion material belongs.

In some embodiments, the light-emitting substrate further includes a substrate. The substrate serves as the first material layer in each sub-pixel. Forming the pixel layer, includes: forming the first light extraction layer on the substrate; forming the second material layer in each sub-pixel on the substrate; and forming the light-emitting element on the substrate.

Alternatively, the second surface is the surface of the first material layer in each sub-pixel away from the light-emitting element. The substrate is disposed on a side of the first material layer in each sub-pixel away from the light-emitting element. Forming the pixel layer, includes following steps.

The first material layer in each sub-pixel is formed on the substrate. The first light extraction layer is formed on the substrate. The second material layer in each sub-pixel is formed on the substrate. The light-emitting element is formed on the substrate.

In some embodiments, pixel driving circuits are further disposed on the substrate, and the plurality of sub-pixels further include at least one second sub-pixel. The light-emitting substrate has a plurality of pixel regions. The plurality of sub-pixels constitute at least one sub-pixel group, and each sub-pixel group is located in a pixel region in the plurality of pixel regions. The sub-pixel group includes at least one first sub-pixel and at least one second sub-pixel. In the sub-pixel group, light-emitting elements included in sub-pixels are first light-emitting diodes, and have a same light-emitting color. The first light-emitting diodes include a first electrode, second electrodes, and a semiconductor layer disposed between the first electrode and the second electrodes. The light-emitting elements included in the sub-pixels share the same first electrode. Forming the light-emitting element on the substrate, includes following steps.

A plurality of second light-emitting diodes are manufactured. Each second light-emitting diode includes a plurality of first light-emitting diodes in a sub-pixel group. The plurality of first light-emitting diodes include a first electrode, second electrodes, and a semiconductor layer formed between the first electrode and the second electrodes. The plurality of first light-emitting diodes share the same first electrode.

The plurality of second light-emitting diodes are transferred onto the substrate. The plurality of first light-emitting diodes included in each second light-emitting diode are electrically connected to respective pixel driving circuits through the first electrode and respective second electrodes.

In some embodiments, the first light extraction layer includes a lens structure and a grating structure disposed on a side of the lens structure away from the light-emitting element. The light-emitting element is a first light-emitting diode.

Forming the first light extraction layer on the substrate, includes following steps.

The grating structure is formed on the substrate. The lens structure is formed on a side of the first light-emitting diode where a light exit surface of the first light-emitting diode is located before the plurality of second light-emitting diodes are transferred onto the substrate. The plurality of second light-emitting diodes and the lens structure are transferred onto the substrate synchronously.

Alternatively, forming the first light extraction layer on the substrate, includes following steps. The grating structure is formed on the substrate. Before the plurality of second light-emitting diodes are transferred onto the substrate, a transparent material layer is formed on the substrate and in a region where the grating structure is located. The lens structure is formed on a side of the transparent material layer away from the grating structure by coining. A refractive index of the transparent material layer is in a range of 1.2 to 1.3, inclusive.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

FIG. 1M is a structural diagram of another grating structure, in accordance with some embodiments;

FIG. 1N is a structural diagram of yet another grating structure, in accordance with some embodiments;

FIG. 1O is a structural diagram of a first light extraction layer, in accordance with some embodiments;

DETAILED DESCRIPTION

Figure 1A:
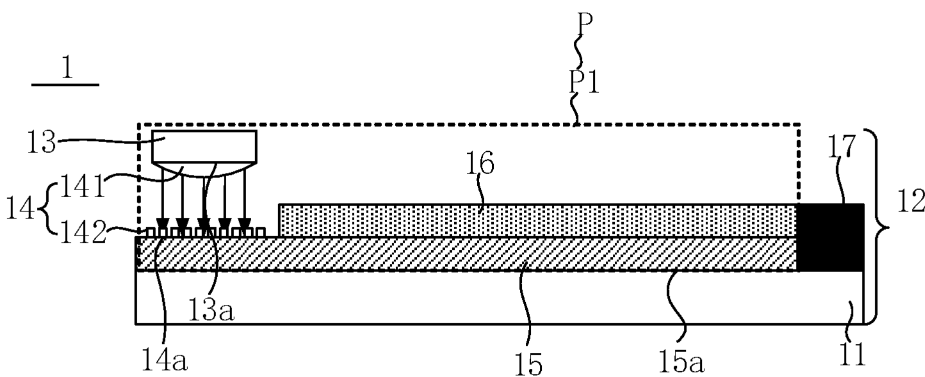
FIG. 1A is a sectional view of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes a light-emitting substrate. Of course, the light-emitting apparatus may further include other components, such as a circuit for providing electrical signals to the light-emitting substrate to drive the light-emitting substrate to emit light. The circuit may be referred to as a control circuit, and may include a circuit board and/or an integrated circuit (IC) electrically connected to the light-emitting substrate.

In some embodiments, the light-emitting apparatus may be a lighting apparatus, and in this case, the light-emitting apparatus serves as a light source to realize a lighting function. For example, the light-emitting apparatus may be a backlight module in a liquid crystal display apparatus, a lamp for internal or external lighting, or a signal lamp.

In some other embodiments, the light-emitting apparatus may be a display apparatus, and in this case, the light-emitting substrate is a display substrate for realizing a function of displaying an image (i.e., screen). The light-emitting apparatus may include a display or a product including a display. The display may be a flat panel display (FPD), or a microdisplay. The display may be a transparent display or an opaque display, depending on whether a user can see a scene behind the display. The display may be a flexible display or a normal display (which may be referred to as a rigid display), depending on whether the display is bendable or rollable. For example, the product including the display may be a computer display, a television, a billboard, a laser printer with a display function, a telephone, a mobile phone, a personal digital assistant (PDA), a laptop computer, a digital camera, a camcorder, a viewfinder, a vehicle, a large area wall, a theater screen, or a stadium sign.

Some embodiments of the present disclosure provide the light-emitting substrate. As shown in FIGS. 1A to 1F, the light-emitting substrate 1 includes a pixel layer 12. The pixel layer 12 includes a plurality of sub-pixels P. Each sub-pixel P includes a light-emitting element 13, a first light extraction layer 14 disposed on a side of the light-emitting element 13 where a light exit surface 13*a* of the light-emitting element 13 is located, a first material layer 15 disposed on a side of the first light extraction layer 14 where a first surface 14*a* of the first light extraction layer 14 is located, and a second material layer 16 that is in contact with a surface of the first material layer 15 opposite to a second surface 15*a* of the first material layer 15. The light-emitting element 13 is configured to emit light of a first color. The first light extraction layer 14 is configured to deflect the light emitted from the light-emitting element 13 into the first material layer 15 at a preset angle. The first material layer 15 and the second material layer 16 are configured to enable the light deflected at the preset angle to propagate in the first material layer 15 and the second material layer 16. The first surface 14*a* is a surface of the first light extraction layer 14 away from the light-emitting element 13. The second surface 15*a* is a surface of the first material layer 15 proximate to or away from the light-emitting element 13. The plurality of sub-pixels P include at least one first sub-pixel P1. Of a first material layer 15 and a second material layer 16 included in the at least one first sub-pixel P1, at least the second material layer 16 includes a first light conversion material. The first light conversion material is configured to absorb light propagating in a first material layer 15 and a second material layer 16 included in a first reference sub-pixel, and to convert the absorbed light into emergent light of a second color. The first reference sub-pixel is a first sub-pixel P1 to which the first light conversion material belongs.

In some embodiments, the second surface 15*a* and a third surface 16*a* reflect reference light, so that the light deflected at the preset angle propagates in the first material layer 15 and the second material layer 16. The third surface 16*a* is a surface of the second material layer 16 away from the first material layer 15. The reference light is light deflected into the first material layer 15 at the preset angle and entering the first material layer 15 and the second material layer 16 during propagation.

Figure 1B:
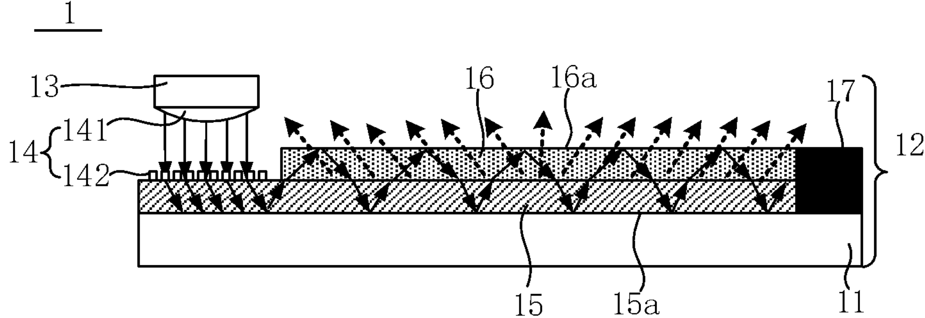
FIG. 1B is a structural diagram showing light emitted from a sub-pixel in FIG. 1A, in accordance with some embodiments.

It will be noted that according to the fact that of the first material layer 15 and the second material layer 16 included in the at least one first sub-pixel P1, at least the second material layer 16 includes the first light conversion material, there may be two possible cases. In a first case, the first material layer 15 included in the at least one first sub-pixel P1 does not include the first light conversion material, and the second material layer 16 included in the at least one first sub-pixel P1 includes the first light conversion material. In this case, a propagation path of the light deflected at the preset angle in the first material layer 15 and the second material layer 16 and a mechanism of action of the first light conversion material are as follows. As shown in FIG. 1B, firstly, the light deflected into the first material layer 15 at the preset angle is reflected by the second surface 15*a*, so that the light deflected into the first material layer 15 at the preset angle propagates in the first material layer 15. Next, when the light deflected into the first material layer 15 at the preset angle propagates to the second material layer 16, the light deflected into the first material layer 15 at the preset angle enters the second material layer 16, and is reflected by the third surface 16*a*, so as to propagate in the second material layer 16. In this process, of the light deflected into the first material layer 15 at the preset angle, a part (which is referred to as a first part herein) is absorbed by the first light conversion material included in the second material layer 16 and exits after wavelength conversion, and a remaining part (which is referred to as a second part herein) that is unabsorbed by the second material layer 16 enters the first material layer 15 and continues to propagate in the first material layer 15. By repeating the above steps, the light deflected into the first material layer 15 at the preset angle may be continuously absorbed by the first light conversion material included in the second material layer 16, thereby improving a light conversion efficiency. In a second case, the first material layer 15 and the second material layer 16 included in the at least one first sub-pixel P1 each include the first light conversion material. In this case, the propagation path of the light deflected at the preset angle in the first material layer 15 and the second material layer 16 and the mechanism of action of the first light conversion material are as follows. Firstly, the light deflected into the first material layer 15 at the preset angle is reflected by the second surface 15*a*, so that the light deflected into the first material layer 15 at the preset angle propagates in the first material layer 15. At the same time, of the light deflected into the first material layer 15 at the preset angle, a part (which is referred to as a first part herein) is absorbed by the first light conversion material included in the first material layer 15 and exits after the wavelength conversion, and a remaining part (which is referred to as a second part herein) that is unabsorbed by the first light conversion material included in the first material layer 15 propagates to the second material layer 16 and then enters the second material layer 16, and is reflected by the third surface 16*a*, so as to propagate in the second material layer 16. In this process, of the second part, a part (which is referred to as a first sub-part herein) is absorbed by the first light conversion material included in the second material layer 16 and exits after the wavelength conversion, and a remaining part (which is referred to as a second sub-part herein) that is unabsorbed by the first light conversion material included in the second material layer 16 enters the first material layer 15 and continues to propagate in the first material layer 15. By repeating the above steps, the light deflected into the first material layer 15 at the preset angle may be continuously absorbed by the first light conversion material included in the first material layer 15 and the first light conversion material included in the second material layer 16, thereby improving the light conversion efficiency.

Materials of the first material layer 15 and the second material layer 16 may be selected to control a refractive index of the first material layer 15 and a refractive index of the second material layer 16, so that the reference light is able to be totally reflected at an interface between the first material layer 15 and a dielectric layer located on a side of the first material layer 15 away from the second material layer 16, and a part (e.g., the second part) of the reference light is able to be totally reflected at an interface between the second material layer 16 and a dielectric layer located on a side of the second material layer 16 away from the first material layer 15 when the part of the reference light enters the second material layer 16, so as to realize the function of reflecting the reference light by the second surface 15*a* and the third surface 16*a*.

Figure 1C:
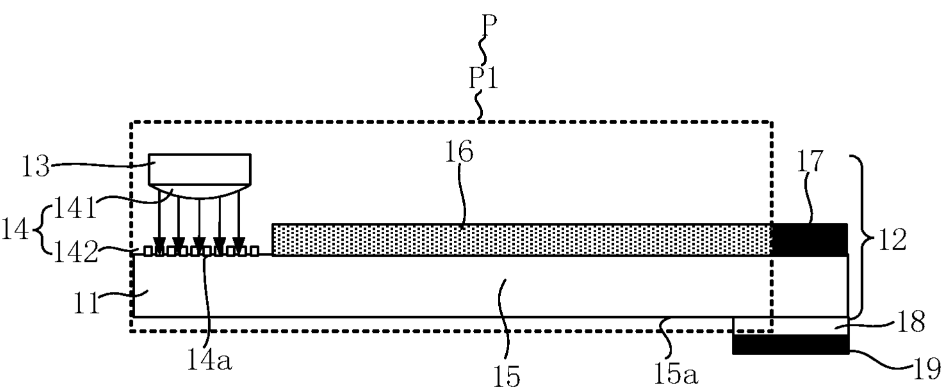
FIG. 1C is a sectional view of another light-emitting substrate, in accordance with some embodiments.

In some embodiments, the light-emitting substrate 1 further includes a substrate 11. As shown in FIG. 1C, the substrate 11 serves as first material layers 15 in the plurality of sub-pixels P. Alternatively, as shown in FIG. 1A, the second surface 15*a* is the surface of the first material layer 15 away from the light-emitting element 13, and the substrate 11 is disposed on a side of the first material layer 15 away from the light-emitting element 13, and is in contact with the first material layer 15.

In these embodiments, in a case where the substrate 11 serves as the first material layers 15, the substrate 11 may be made of glass. In this case, in order to enable the reference light to be totally reflected at the interface between the first material layer 15 and the dielectric layer (which refers to an air layer herein, as shown in FIG. 1C) located on the side of the first material layer 15 away from the second material layer 16, and to enable the part of the reference light to be totally reflected at the interface between the second material layer 16 and the dielectric layer (which refers to the air layer with a refractive index of approximately 1 herein) located on the side of the second material layer 16 away from the first material layer 15 when the part of the reference light enters the second material layer 16, a refractive index of the substrate 11 may be in a range of 1.45 to 1.55, inclusive, and the refractive index of the second material layer 16 may be in a range of 1.4 to 1.6, inclusive. In this case, when the refractive index of the substrate 11 and the refractive index of the second material layer 16 are determined, by setting a suitable deflection angle (which may be a preset angle herein, and the preset angle refers to an included angle between the light deflected into the first material layer 15 and a normal of the light exit surface), the reference light may be totally reflected at the interface between the first material layer 15 and the dielectric layer located on the side of the first material layer 15 away from the second material layer 16, and the part of the reference light entering the second material layer 16 may be totally reflected at the interface between the second material layer 16 and the dielectric layer located on the side of the second material layer 16 away from the first material layer 15.

For example, the preset angle may be greater than 25 degrees. For example, the preset angle may be 40 degrees.

In a case where the second surface 15*a* is the surface of the first material layer 15 away from the light-emitting element 13, since the substrate 11 is disposed on the side of the first material layer 15 away from the light-emitting element 13, the dielectric layer located on the side of the first material layer 15 away from the second material layer 16 is the substrate 11. In this case, in order to enable the reference light to be totally reflected at the interface between the first material layer 15 and the dielectric layer (which refers to the substrate 11 herein, as shown in FIG. 1A) located on the side of the first material layer 15 away from the second material layer 16, and to enable the part of the reference light to be totally reflected at the interface between the second material layer 16 and the dielectric layer (which may be the air layer herein) located on the side of the second material layer 16 away from the first material layer 15 when the part of the reference light enters the second material layer 16, the refractive index of the substrate 11 may be in a range of 1.45 to 1.55, inclusive, the refractive index of the first material layer 15 may be in a range of 1.7 to 1.9, inclusive, and the refractive index of the second material layer 16 may be in a range of 1.5 to 1.7, inclusive. In this case, when the refractive index of the substrate 11, the refractive index of the first material layer 15 and the refractive index of the second material layer 16 are determined, by setting a suitable deflection angle (which may be the preset angle herein, and the preset angle refers to the included angle between the light deflected into the first material layer 15 and the normal of the light exit surface), the reference light may be totally reflected at the interface between the first material layer 15 and the dielectric layer located on the side of the first material layer 15 away from the second material layer 16, and the part of the reference light entering the second material layer 16 may be totally reflected at the interface between the second material layer 16 and the dielectric layer located on the side of the second material layer 16 away from the first material layer 15.

For example, the preset angle may be greater than 25 degrees. For example, the preset angle may be 50 degrees.

In some embodiments, as shown in FIGS. 1A to 1D, in the case where the second surface 15*a* is the surface of the first material layer 15 away from the light-emitting element 13, an area of an orthographic projection of the first material layer 15 on a plane where the pixel layer 12 is located is greater than an area of an orthographic projection of the first light extraction layer 14 on the plane where the pixel layer 12 is located, and the second material layer 16 is disposed on a portion, beyond a region where the first light extraction layer 14 is located, of the surface of the first material layer 15 facing the light-emitting element 13.

That is, in these embodiments, the second surface 15*a* and the third surface 16*a* are respectively located on two opposite sides of the first material layer 15 along a thickness direction of the first material layer 15. In this case, the second material layer 16 and the light-emitting element 13 are located on the same side of the first material layer 15 along the thickness direction of the first material layer 15. An area of an orthogonal projection, on the plane where the pixel layer 12 is located, of a region where the second material layer 16 is located may be equal to a difference between an area of an orthogonal projection, on the plane where the pixel layer 12 is located, of a region where the first material layer 15 is located and an area of an orthogonal projection, on the plane where the pixel layer 12 is located, of a region where the light-emitting element 13 is located. In this case, a thickness of the entire light-emitting substrate 1 may be reduced to some extent.

Figure 1D:
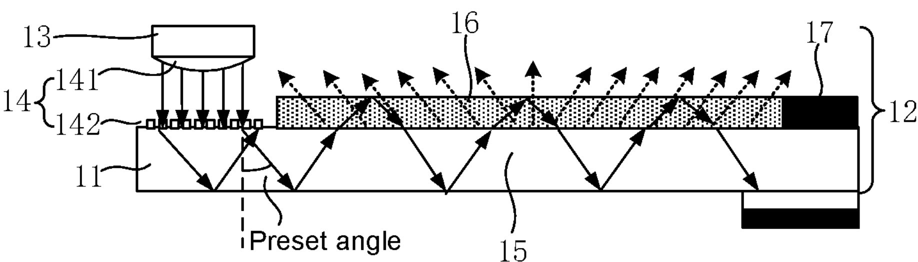
FIG. 1D is a structural diagram showing light emitted from a sub-pixel in FIG. 1C, in accordance with some embodiments.

Moreover, since the first material layer 15 and the second material layer 16 are configured to enable the light deflected at the preset angle to propagate in the first material layer 15 and the second material layer 16, and at least the second material layer 16 of the first material layer 15 and the second material layer 16 included in the at least one first sub-pixel P1 includes the first light conversion material, in a case where the second material layer 16 included in the at least one first sub-pixel P1 includes the first light conversion material and the first material layer 15 included in the at least one first sub-pixel P1 does not include the first light conversion material, in order to improve a light extraction efficiency, the at least one first sub-pixel P1 may emit light toward a side of the first material layer 15 facing the second material layer 16 (as shown in FIG. 1D, the at least one first sub-pixel P1 may emit light upward herein). In a case where the at least one first sub-pixel P1 may emit light toward a side of the first material layer 15 facing away from the second material layer 16, the light emitted from the at least one first sub-pixel P1 needs to exit through the substrate 11, which reduces the light extraction efficiency. In a case where the first material layer 15 and the second material layer 16 included in the at least one first sub-pixel P1 each include the first light conversion material, the at least one first sub-pixel P1 may emit light toward the side of the first material layer 15 facing the second material layer 16 and the side of the first material layer 15 facing away from the second material layer 16. Of course, in order to improve the light extraction efficiency, the at least one first sub-pixel P1 may emit light toward the side of the first material layer 15 facing the second material layer 16. A specific principle may refer to the above description that the second material layer 16 included in the at least one first sub-pixel P1 includes the first light conversion material, and the first material layer 15 included in the at least one first sub-pixel P1 does not include the first light conversion material.

Figure 1E:
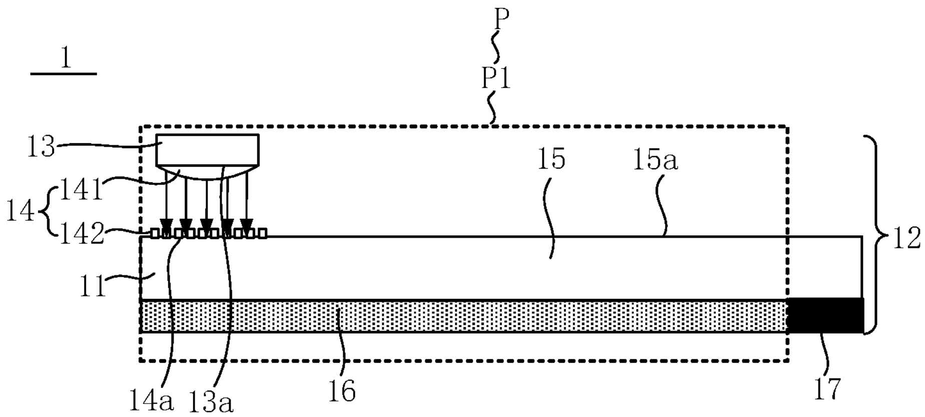
FIG. 1E is a sectional view of yet another light-emitting substrate, in accordance with some embodiments.
Figure 1F:
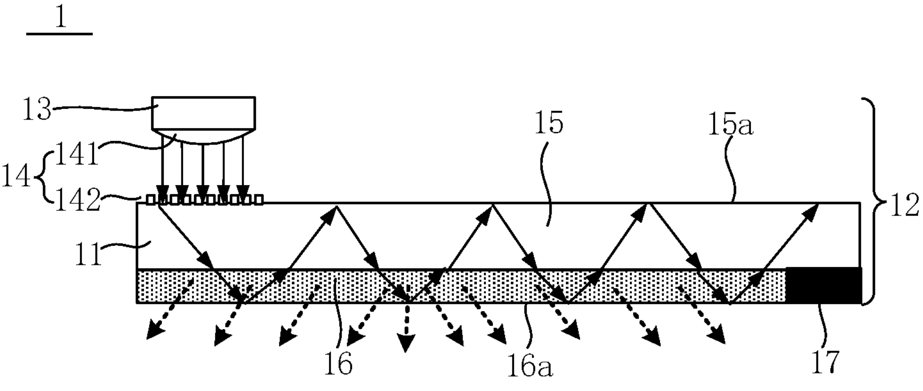
FIG. 1F is a structural diagram showing light emitted from a sub-pixel in FIG. 1E, in accordance with some embodiments.

In some other embodiments, as shown in FIGS. 1E and 1F, in a case where the second surface 15*a* is the surface of the first material layer 15 proximate to the light-emitting element 13, the area of the orthographic projection of the first material layer 15 on the plane where the pixel layer 12 is located is greater than or equal to the area of the orthographic projection of the first light extraction layer 14 on the plane where the pixel layer 12 is located, and the second material layer 16 is disposed on the surface of the first material layer 15 away from the light-emitting element 13.

That is, in these embodiments, the second material layer 16 and the light-emitting element 13 are respectively located on the two opposite sides of the first material layer 15 along the thickness direction of the first material layer 15. The area of the orthogonal projection, on the plane where the pixel layer 12 is located, of the region where the second material layer 16 is located may be equal to the area of the orthogonal projection, on the plane where the pixel layer 12 is located, of the region where the first material layer 15 is located. Since the area of the orthographic projection of the first material layer 15 on the plane where the pixel layer 12 is located is greater than or equal to the area of the orthographic projection of the first light extraction layer 14 on the plane where the pixel layer 12 is located, the area of the orthogonal projection, on the plane where the pixel layer 12 is located, of the region where the first material layer 15 is located may be greater than or equal to the area of the orthogonal projection, on the plane where the pixel layer 12 is located, of the region where the light-emitting element 13 is located. That is, the area of the orthogonal projection, on the plane where the pixel layer 12 is located, of the region where the second material layer 16 is located is greater than or equal to the area of the orthogonal projection, on the plane where the pixel layer 12 is located, of the region where the light-emitting element 13 is located. In this case, a high pixel density (i.e., pixels per inch, PPI) may be realized, and the higher the PPI, the finer the display effect.

Moreover, since the first material layer 15 and the second material layer 16 are configured to enable the light deflected at the preset angle to propagate in the first material layer 15 and the second material layer 16, and at least the second material layer 16 of the first material layer 15 and the second material layer 16 included in the at least one first sub-pixel P1 includes the first light conversion material, in the case where the second material layer 16 included in the at least one first sub-pixel P1 includes the first light conversion material and the first material layer 15 included in the at least one first sub-pixel P1 does not include the first light conversion material, in order to improve the light extraction efficiency, the at least one first sub-pixel P1 may emit light toward a side of the first material layer 15 facing the second material layer 16 (as shown in FIG. 1F, the at least one first sub-pixel P1 may emit light downward herein). In a case where the at least one first sub-pixel P1 may emit light toward a side of the first material layer 15 facing away from the second material layer 16, the light emitted from the at least one first sub-pixel P1 needs to exit through the substrate 11, which reduces the light extraction efficiency. In the case where the first material layer 15 and the second material layer 16 included in the at least one first sub-pixel P1 each include the first light conversion material, according to the fact that the area of the orthographic projection of the first material layer 15 on the plane where the pixel layer 12 is located is greater than or equal to the area of the orthographic projection of the first light extraction layer 14 on the plane where the pixel layer 12 is located, there are two possible cases. In a first case, the area of the orthographic projection of the first material layer 15 on the plane where the pixel layer 12 is located is greater than the area of the orthographic projection of the first light extraction layer 14 on the plane where the pixel layer 12 is located. In this case, the at least one first sub-pixel P1 may emit light toward the side of the first material layer 15 facing the second material layer 16 and the side of the first material layer 15 facing away from the second material layer 16. In a second case, the area of the orthographic projection of the first material layer on the plane where the pixel layer 12 is located is equal to the area of the orthographic projection of the first light extraction layer 14 on the plane where the pixel layer 12 is located. In this case, the at least one first sub-pixel P1 may emit light toward the side of the first material layer 15 facing the second material layer 16.

Of course, in these embodiments, in order to realize a high pixel density (i.e., pixels per inch, PPI), the area of the orthographic projection of the first material layer 15 on the plane where the pixel layer 12 is located is equal to the area of the orthographic projection of the first light extraction layer 14 on the plane where the pixel layer 12 is located. That is, the at least one first sub-pixel P1 emits light toward the side of the first material layer 15 facing the second material layer 16. That is, the at least one first sub-pixel P1 emits light downward.

For example, the light-emitting element 13 may be an electroluminescent element, such as an organic light-emitting diode (OLED) element or a light-emitting diode (LED). For example, the first light conversion material may be a quantum dot light-emitting material.

Compared with an OLED light-emitting device that emits light by using an organic electroluminescent material and a light-emitting diode that emits light by using a PN junction, the quantum dot light-emitting material is a semiconductor crystal that has a quantum confinement effect in three spatial dimensions. The quantum confinement effect means that when a geometric radius of a semiconductor crystal material is reduced to be less than an exciton bohr radius (nanoscale) of its bulk material, electronic energy levels (e.g., energy levels of valence and conduction bands of the semiconductor crystal material) near the Fermi level each split from a continuum into discrete energy levels. Within this size, the quantum dot light-emitting material has different excited state energy levels under different sizes, and energy of corresponding emergent photons is different. Therefore, a wavelength of emergent light of the quantum dot light-emitting material may be controlled by controlling the radius of the quantum dot light-emitting material. Moreover, compared with the organic electroluminescent material and the PN junction, the quantum dot light-emitting material has the advantages of higher theoretical luminous efficiency, wider color gamut, better color saturation and vividness, and lower energy costs.

Based on the above, the light-emitting element 13 emits the light of the first color (such as blue light), and then the light of the first color is converted into the light of the second color (such as red light or green light) by using the quantum dot light-emitting material, so that a mode of combining the light-emitting element 13 having a high blue light luminous efficiency with the quantum dot light-emitting material may be selected to improve a luminous efficiency of light of other colors (such as red light or green light), thereby integrally improving the luminous efficacy and the luminous effect of the light-emitting substrate.

In some embodiments, the light-emitting element 13 is the light-emitting diode. For the light-emitting diodes, blue and green light may be obtained from InGaN-based materials with a corresponding bandgap of about 2.7 eV, and red light may be obtained from GaAs-based materials with a corresponding bandgap of about 1.7 eV. However, the green LED causes deterioration of device performance due to the composition segregation effect and the generation of V-type defects caused by high In composition, and causes decrease of luminous efficiency due to the quantum confinement stark effect (QCSE) caused by the polarization effect. The red LED has a low light extraction efficiency due to a high refractive index (e.g., a refractive index of 3.9 for 600 nm light) of the GaAs material. Therefore, application of the red LED and the green LED is limited.

In these embodiments, by selecting the light-emitting diode as the light-emitting element 13, the advantage of the high blue light luminous efficiency of the light-emitting diode and the advantage of the quantum dot light-emitting material in improving the luminous efficiency of light of other colors may be well utilized, so as to integrally improve the luminous efficacy and the luminous effect of the light-emitting substrate.

However, in the related art, for a combination of a light-emitting element (which is a light-emitting diode or an OLED light-emitting device) and a quantum dot light-emitting material, not all of solutions in which the light-emitting element (which is the light-emitting diode or the OLED light-emitting device) is combined with the quantum dot light-emitting material can improve the luminous efficiency. The quantum dot light-emitting material needs to be selected according to actual situations, and even scattering particles need to be doped in the quantum dot light-emitting material, so as to improve the luminous efficiency and the light conversion efficiency of the quantum dot light-emitting material.

At present, the mature quantum dot light-emitting materials mainly include CdSe-based materials and InP-based materials. The CdSe-based quantum dot light-emitting materials have the advantages of high luminous efficiency, narrow half-peak width, little self-absorption, and good stability, but Cd has large harmfulness to the environment, and is greatly limited by the environmental regulations. The InP-based materials have a slightly lower luminous efficiency than the CdSe-based materials, and have a severe red shift at a high concentration. Therefore, in a case where the InP-based quantum dot light-emitting material serves as a light conversion layer, a large film thickness and a certain concentration range are required to realize a high luminous efficiency and a high absorption efficiency. Especially, in a case where the quantum dot light-emitting material is doped without scattering particles, in order to ensure a high absorption efficiency and a high luminous efficiency, the film thickness of the light conversion layer is generally large, and is about 10 μm or more. Therefore, the light conversion layer cannot be well applied to a high PPI pixel design. For example, a sub-pixel pitch of a 400 PPI light-emitting substrate is 21 by 63 μm, and a sub-pixel pitch of an 800 PPI light-emitting substrate is 10.5 by 31.5 μm, so that an application of the light conversion layer to a high PPI display is limited.

In the embodiments of the present disclosure, the first light extraction layer 14 is disposed, the first material layer 15 is disposed on the side of the first light extraction layer 14 away from the light-emitting element 13, and the second material layer 16 is disposed on the surface of the first material layer 15 that is opposite to the second surface **15*a* of the first material layer 15. The first light extraction layer 14 is configured to deflect the light emitted from the light-emitting element 13 into the first material layer 15 at the preset angle, and the first material layer 15 and the second material layer 16 are configured to enable the light deflected at the preset angle to propagate in the first material layer 15 and the second material layer 16. At least the second material layer 16 of the first material layer 15 and the second material layer 16 included in the at least one first sub-pixel P1 includes the first light conversion material. Therefore, in an example where each sub-pixel P emits light upward, as shown in FIGS. 1B and 1D, by utilizing transmission characteristics of electromagnetic waves at interfaces between dielectric layers (such as the first light extraction layer 14, the first material layer 15 and the second material layer 16), the light emitted from the light-emitting element 13 is able to repeatedly oscillate and propagate in the first material layer 15 and the second material layer 16. In the case where the second material layer 16 includes the first light conversion material and the first material layer 15 does not include the first light conversion material, the first light conversion material included in the second material layer 16 is able to constantly perform absorption and wavelength conversion on the light that repeatedly oscillates in the first material layer 15 and the second material layer 16, thereby improving the light conversion efficiency. In the case where the first material layer 15 and the second material layer 16 each include the first light conversion material, the light emitted from the light-emitting element 13 is able to repeatedly oscillate and propagate in the first material layer 15 and the second material layer 16. In this process, the first light conversion material included in the first material layer 15 is able to perform absorption and wavelength conversion on the light that repeatedly oscillates in the first material layer 15, and the first light conversion material included in the second material layer 16 is able to perform absorption and wavelength conversion on the light that repeatedly oscillates in the second material layer 16**, thereby improve the light conversion efficiency as well.

In summary, the first material layer 15 and the second material layer 16 are disposed, and the light deflected at the preset angle into the first material layer 15 repeatedly oscillates in the first material layer 15 and the second material layer 16, so that the first light conversion material included in at least the second material layer 16 of the first material layer 15 and the second material layer 16 may repeatedly absorb and convert the light deflected at the preset angle into the first material layer 15. Compared with the related art in which scattering particles need to be doped in the quantum dot light-emitting material to improve the light conversion efficiency in a case where wavelength conversion is performed on light emitted from the light-emitting element by using the quantum dot light-emitting material, it is not necessary to dope scattering particles in the quantum dot light-emitting material, so that a thickness of a light conversion layer (e.g., the first material layer 15 and the second material layer 16 in which at least the second material layer 16 includes the first light conversion material) may be reduced, so as to realize the high PPI display.

In addition, compared with the related art in which the quantum dot light-emitting material is doped with scattering particles, it is not necessary to dope scattering particles in the light conversion layer in the embodiments of the present disclosure, which may simplify the manufacturing process and reduce the manufacturing cost.

Here, it will be noted that in the above embodiments, the first reference sub-pixel is the first sub-pixel P1 to which the first light conversion material belongs, which means that the first reference sub-pixel is any one of the at least one first sub-pixel P1, and the light conversion material included in this first sub-pixel absorbs and converts the light in the first material layer 15 and the second material layer 16 included in this first sub-pixel.

The plurality of sub-pixels P may all be the first sub-pixels P1, or part of the plurality of sub-pixels P may be the first sub-pixel(s) P1.

In a case where the plurality of sub-pixels P are all the first sub-pixels P1, the light-emitting substrate 1 emits monochromatic light, such as red light or green light. In this case, the light-emitting substrate may be used for lighting, i.e., may be applied to a lighting apparatus. Alternatively, the light-emitting substrate may be used for displaying an image or a screen of a single color, i.e., may be applied to a display apparatus.

In a case where the part of the plurality of sub-pixels P are the first sub-pixel(s) P1, the remaining sub-pixels P may emit light of other colors. For example, in a case where the first sub-pixel P1 emits red light, the remaining sub-pixels P may emit green light, blue light or white light. In a case where the first sub-pixel P1 emits green light, the remaining sub-pixels P may emit red light, blue light or white light. Here, the light-emitting color of the remaining sub-pixels P is not particularly limited.

In some embodiments, as shown in FIGS. 1G, 1H, 1I and 1J, the plurality of sub-pixels P further include at least one second sub-pixel P2. Of a first material layer 15 and a second material layer 16 included in the at least one second sub-pixel P2, at least the second material layer 16 includes a second light conversion material. The second light conversion material is configured to absorb light propagating in a first material layer 15 and a second material layer 16 included in a second reference sub-pixel, and to convert the absorbed light into emergent light of a third color. Alternatively, of the first material layer 15 and the second material layer 16 included in the at least one second sub-pixel P2, at least the second material layer includes first scattering particles. The first scattering particles are configured to scatter the light propagating in the first material layer 15 and the second material layer 16 included in the second reference sub-pixel. The second reference sub-pixel is a second sub-pixel P2 to which the second light conversion material belongs or the first scattering particles belong.

Here, in a case where at least the second material layer 16 of the first material layer 15 and the second material layer 16 included in the at least one second sub-pixel P2 includes the second light conversion material, the second reference sub-pixel is a second sub-pixel P2 to which the second light conversion material belongs. In a case where at least the second material layer 16 of the first material layer 15 and the second material layer 16 included in the at least one second sub-pixel P2 includes the first scattering particles, the second reference sub-pixel is a second sub-pixel P2 to which the first scattering particles belong.

The second reference sub-pixel is the second sub-pixel P2 to which the second light conversion material belongs, which means that the second reference sub-pixel is any one of the at least one second sub-pixel, and the second light conversion material included in this second sub-pixel absorbs and converts light in the first material layer 15 and the second material layer 16 included in this second sub-pixel. In the case where at least the second material layer 16 of the first material layer 15 and the second material layer 16 included in the at least one second sub-pixel P2 includes the first scattering particles, the second reference sub-pixel is the second sub-pixel P2 to which the first scattering particles belong, which means that the second reference sub-pixel is any one of the at least one second sub-pixel, and the first scattering particles included in this second sub-pixel scatter the light in the first material layer 15 and the second material layer 16 included in this second sub-pixel.

In these embodiments, a propagation path of the light deflected at the preset angle in the first material layer 15 and the second material layer 16 included in the at least one second sub-pixel P2 and a mechanism of action of the second light conversion material may respectively refer to the propagation path of the light deflected at the preset angle in the first material layer 15 and the second material layer 16 included in the at least one first sub-pixel P1 and the mechanism of action of the first light conversion material, and will not be repeated here. In the case where at least the second material layer 16 of the first material layer 15 and the second material layer 16 included in the at least one second sub-pixel P2 includes the first scattering particles, a mechanism of action of the first scattering particles is substantially the same as the mechanism of action of the second light conversion material. A difference is that the first scattering particles only function to scatter the light (i.e., the light of the first color) deflected at the preset angle, and do not perform wavelength conversion on the light (i.e., the light of the first color) deflected at the preset angle.

In these embodiments, the light-emitting substrate 1 may emit color-adjustable light (i.e., colored light). For example, in a case where the first color is blue, the second color may be red, and the third color may be green. In this case, if at least the second material layer of the first material layer 15 and the second material layer 16 included in the at least one second sub-pixel P2 includes the second light conversion material, the light-emitting substrate 1 may emit red light and green light. If at least the second material layer of the first material layer 15 and the second material layer 16 included in the at least one second sub-pixel P2 includes the first scattering particles, the light-emitting substrate 1 may emit blue light and red light.

In this case, the light-emitting substrate 1 may be used for lighting and decoration, i.e., may be applied to a lighting apparatus. Alternatively, the light-emitting substrate 1 may be used for displaying an image or a screen, i.e., may be applied to a display apparatus.

Figure 1G:
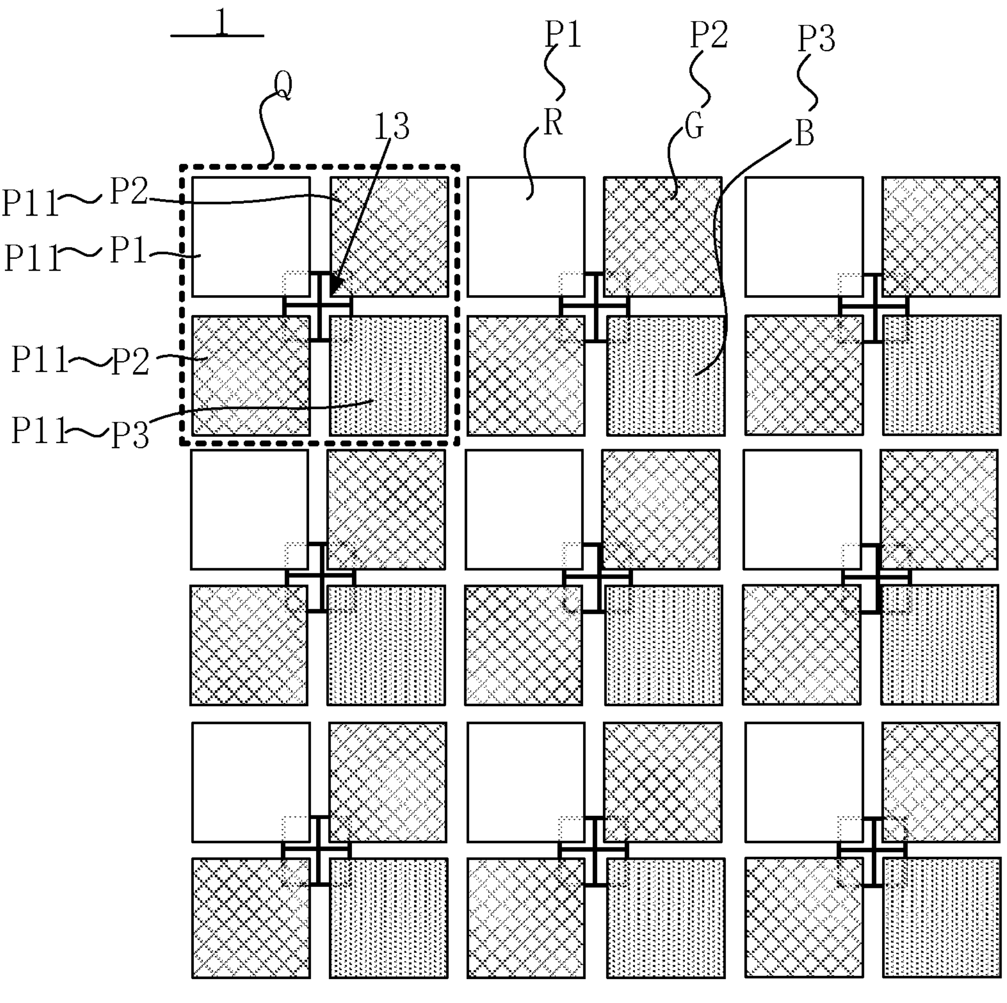
FIG. 1G is a top view of a light-emitting substrate, in accordance with some embodiments.
Figure 1H:
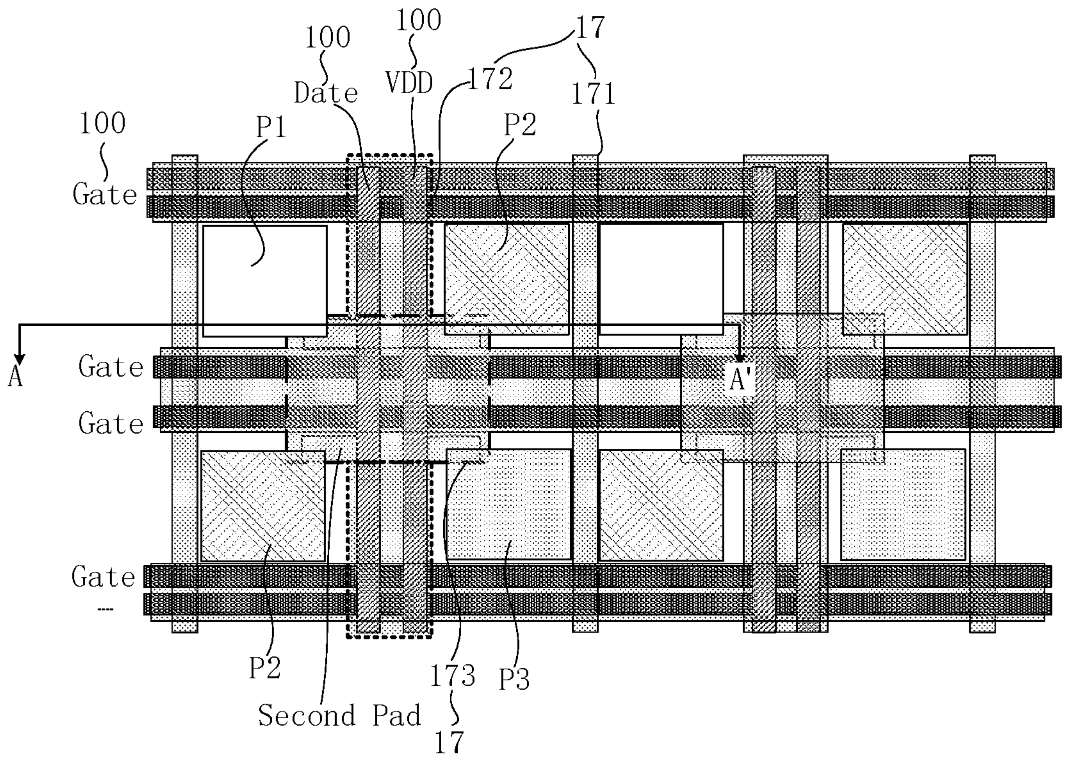
FIG. 1H is a top view of another light-emitting substrate, in accordance with some embodiments.
Figure 1I:
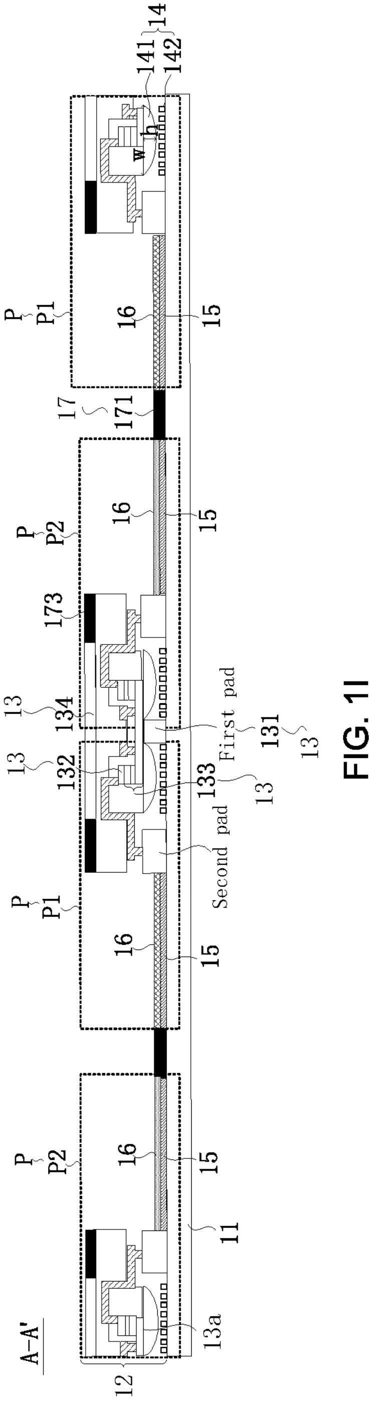
FIG. 1I is a sectional view taken along the A-A' direction in FIG. 1H, in accordance with some embodiments.

In some embodiments, as shown in FIGS. 1G, 1H and 1I, the light-emitting substrate 1 has a plurality of pixel regions Q. The plurality of sub-pixels P constitute at least one sub-pixel group P11, and a sub-pixel group P11 is located in a pixel region Q. The sub-pixel group P11 includes sub-pixels P, and the sub-pixels P included in the sub-pixel group P11 include at least one first sub-pixel P1 and at least one second sub-pixel P2. In the sub-pixel group P11, the light-emitting elements 13 included in the sub-pixels P are all first light-emitting diodes, and have the same light-emitting color. The first light-emitting diodes included in the sub-pixel group P11 include a first electrode 131, second electrodes 132, and a semiconductor layer 133 disposed between the first electrode 131 and the second electrodes 132. The light-emitting elements 13 included in the sub-pixels P share the same first electrode 131.

In these embodiments, the sub-pixels P included in the sub-pixel group P11 may constitute a pixel. Here, in an example where the sub-pixels P further include a third sub-pixel P3 in addition to the first sub-pixel P1 and the second sub-pixel P2, and the first sub-pixel P1 is a red sub-pixel, the second sub-pixel P2 is a green sub-pixel, and the third sub-pixel P3 is a blue sub-pixel, a sub-pixel group P11 may include three first light-emitting diodes that respectively serve as light-emitting elements 13 included in three sub-pixels P, and the three first light-emitting diodes share the same first electrode 131.

In the sub-pixel group P11, the light-emitting elements 13 included in the sub-pixels P are all the first light-emitting diodes, and the light-emitting elements 13 included in the sub-pixels P share the same first electrode 131. Therefore, when the first light-emitting diodes are transferred, an entirety of the first light-emitting diodes included in the sub-pixels P may be transferred without transferring each first light-emitting diode, so that a transfer efficiency and a yield may be improved.

The first electrode 131 may be a cathode, and in this case, the second electrode 132 may be an anode. Alternatively, the first electrode 131 may be an anode, and in this case, the second electrode 132 may be a cathode.

In following embodiments, a description will be made in an example where the first electrode 131 is the cathode, and the second electrode 132 is the anode.

The first light-emitting diode may be a horizontal LED or a vertical LED. In a case where the first light-emitting diode is the horizontal LED, the semiconductor layer 133 may include an N-type semiconductor portion and a P-type semiconductor portion arranged in a same layer. The N-type semiconductor portion may be obtained by doping N-type dopant ions in the intrinsic gallium nitride, and the P-type semiconductor portion may be obtained by doping P-type dopant ions in the intrinsic gallium nitride. In this case, the first electrode 131 and the second electrode 132 may be located on the same side of the semiconductor layer 133. The first light-emitting diodes may be obtained by cutting a P-type semiconductor portion of a large LED provided with a PN junction into a plurality of sub-portions. In an example where the sub-portions included in the plurality of first light-emitting diodes are formed around the N-type semiconductor portion, the first electrode is formed on the N-type semiconductor portion, each sub-portion is provided with a second electrode thereon, and the first electrode 131 formed on the N-type semiconductor portion and the second electrode 132 formed on the sub-portion are electrically connected to a pixel driving circuit, so that the plurality of first light-emitting diodes may share the same first electrode 131.

Figure 1J:
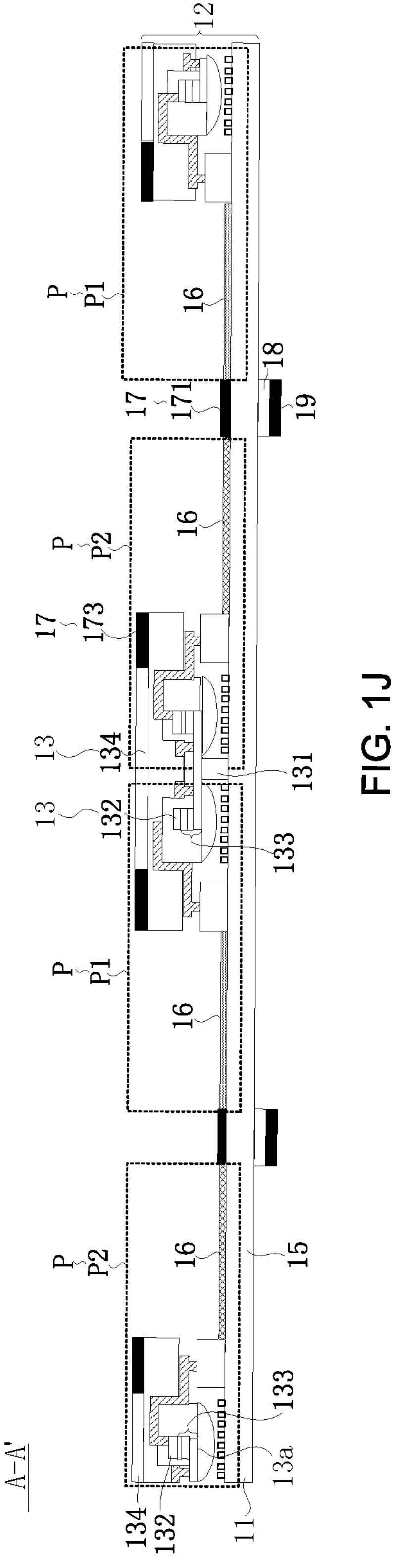
FIG. 1J is another sectional view taken along the A-A' direction in FIG. 1H, in accordance with some embodiments.

In a case where the first light-emitting diode is the vertical LED, the semiconductor layer 133 may include an N-type semiconductor layer and a P-type semiconductor layer. The N-type semiconductor layer may be made of N-type gallium nitride, and the P-type semiconductor layer may be made of P-type gallium nitride. In this case, as shown in FIGS. 1I and 1J, the first electrode 131 and the second electrode 132 are respectively located on two opposite sides of the semiconductor layer 133 along the thickness direction. In this case, the first light-emitting diodes may be obtained by cutting the remaining portion of a large LED except the N-type semiconductor layer into a plurality of portions. The first electrode 131 is formed on the N-type semiconductor layer, each portion is provided with a second electrode 132 thereon, and the first electrode 131 formed on the N-type semiconductor layer and the second electrode 132 formed on the portion are electrically connected to a pixel driving circuit, so that the plurality of first light-emitting diodes may share the same first electrode 131.

Of course, in an actual manufacturing process, the plurality of first light-emitting diodes may be obtained by cutting a semiconductor layer 133 of a large LED into a plurality of portions. Then, the first electrode 131 is manufactured, and is connected to the portions included in respective first light-emitting diodes, so that the plurality of first light-emitting diodes may share the same first electrode 131.

In addition, in order to improve the luminous efficiency, in some embodiments, the semiconductor layer 133 may further include a quantum well structure disposed between the P-type semiconductor layer and the N-type semiconductor layer.

In some embodiments, the first light-emitting diode is the vertical LED, and the first electrode 131 is closer to the first material layer 15 than the second electrode 132.

Compared with the case that the first light-emitting diode is the horizontal LED in which a lateral flow of a current in the N-type semiconductor portion and the P-type semiconductor portion is not conducive to current diffusion and heat dissipation, the vertical LED takes the entire P-type semiconductor layer as the second electrodes 132 that are patterned electrodes, so that a current almost flows vertically through an epitaxial layer of the LED, and a transversely flowing current is rarely generated, which is conducive to the heat dissipation.

Moreover, in these embodiments, compared with a case that the second electrode 132 is closer to the first material layer 15 than the first electrode 131, the first electrode 131 is closer to the first material layer 15 than the second electrode 132, so that an influence on the emergent light due to a fact that light passes through the first electrode 131 may be avoided.

In some embodiments, as shown in FIGS. 1G to 1J, in the sub-pixel group P11, an area of an orthographic projection of a first material layer 15 included in each of the sub-pixels P on the plane where the pixel layer 12 is located is greater than an area of an orthographic projection of a first light extraction layer 14 included in this sub-pixel P on the plane where the pixel layer 12 is located; and portions, beyond a region where first light extraction layers 14 included in the sub-pixels P are located, of orthographic projections of first material layers 15 included in the sub-pixels P on the plane where the pixel layer 12 is located surround a region where light-emitting elements 13 included in the sub-pixels P are located.

Here, in an example where the sub-pixels P emit light upward, the portions, beyond the region where the first light extraction layers 14 included in the sub-pixels P are located, of the orthographic projections of the first material layers 15 included in the sub-pixels P on the plane where the pixel layer 12 is located surround the region where the light-emitting elements 13 included in the sub-pixels P are located, which means that an effective light-emitting region of the sub-pixels P surrounds the region where the light-emitting elements 13 included in the sub-pixels P are located.

In some embodiments, as shown in FIGS. 1I and 1J, the first light-emitting diodes included in the sub-pixel group P11 further include a reflective layer 134 disposed on a side of the first light-emitting diodes away from light exit surfaces 13*a* of the first light-emitting diodes and covering at least a region where the light exit surfaces 13*a* are located.

In these embodiments, the light emitted from the first light-emitting diode may further be reflected to improve the light extraction efficiency of the first light-emitting diode.

In some embodiments, the reflective layer 134 may include a plurality of third material layers and a plurality of fourth material layers that are alternately arranged. A refractive index of the third material layer is less than a refractive index of the fourth material layer.

In these embodiments, the reflective layer 134 is a distributed bragg reflection (DBR), which is a periodic structure formed by alternating dielectric layers. A third material layer and a fourth material layer constitute a period. Researches show that a 20-period DBR film is able to meet a reflection requirement on light of 400 nm to 600 nm.

In some embodiments, the third material layer is made of $TiO_2$, and the fourth material layer is made of $SiO_2$.

Figure 1K:
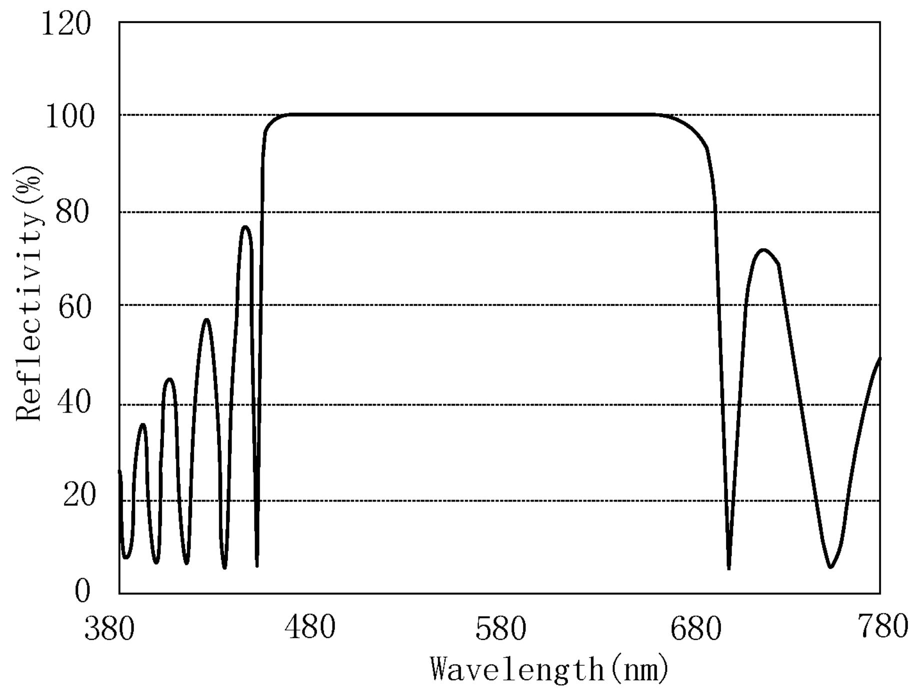
FIG. 1K is a graph showing a reflectivity of a reflective layer, in accordance with some embodiments.

FIG. 1K is a graph showing a reflectivity of the 20-period DBR film that is composed of the third material layers made of $TiO_2$ and the fourth material layers made of $SiO_2$. It can be seen from FIG. 1K that the DBR film has a reflectivity of close to 100% for the light of 400 nm to 650 nm, and has a good reflection effect.

The third material layer has a refractive index of 2.7 and a thickness of 46.54 nm, and the fourth material layer has a refractive index of 1.5 and a thickness of 94.18 nm.

In some embodiments, as shown in FIGS. 1G and 1H, the sub-pixel group P11 further includes at least one third sub-pixel P3. Of a first material layer and a second material layer included in the at least one third sub-pixel P3, at least the second material layer includes a third light conversion material. The third light conversion material is configured to absorb light propagating in a first material layer and a second material layer included in a third reference sub-pixel, and to convert the absorbed light into emergent light of a fourth color. Alternatively, of the first material layer and the second material layer included in the at least one third sub-pixel P3, at least the second material layer includes second scattering particles. The second scattering particles are configured to scatter the light propagating in the first material layer and the second material layer included in the third reference sub-pixel. The second color, the third color and the fourth color are three primary colors, respectively. Alternatively, the second color, the first color and the fourth color are three primary colors, respectively. Alternatively, the second color, the third color and the first color are three primary colors, respectively.

Here, in a case where at least the second material layer of the first material layer and the second material layer included in the at least one third sub-pixel P3 includes the third light conversion material, the third reference sub-pixel is a third sub-pixel to which the third light conversion material belongs. In a case where at least the second material layer of the first material layer and the second material layer included in the at least one third sub-pixel P3 includes the second scattering particles, the third reference sub-pixel is a third sub-pixel to which the second scattering particles belong.

The third reference sub-pixel is the third sub-pixel to which the third light conversion material belongs, which means that the third reference sub-pixel is any one of the at least one third sub-pixel, and the third light conversion material included in this third sub-pixel absorbs and converts light in the first material layer and the second material layer included in this third sub-pixel. In the case where at least the second material layer of the first material layer and the second material layer included in the at least one third sub-pixel P3 includes the second scattering particles, the third reference sub-pixel is the third sub-pixel to which the second scattering particles belong (that is, the third sub-pixel is any one of the at least one third sub-pixel, and the second scattering particles included in this third sub-pixel scatter the light in the first material layer and the second material layer included in this third sub-pixel).

In these embodiments, a propagation path of the light deflected at the preset angle in the first material layer and the second material layer included in the at least one third sub-pixel P3 and a mechanism of action of the third light conversion material may respectively refer to the propagation path of the light deflected at the preset angle in the first material layer and the second material layer included in the at least one first sub-pixel P1 and the mechanism of action of the first light conversion material, and will not be repeated here. In the case where at least the second material layer of the first material layer and the second material layer included in the at least one third sub-pixel P3 includes the second scattering particles, a mechanism of action of the second scattering particles is substantially the same as the mechanism of action of the third light conversion material. A difference is that the second scattering particles only function to scatter the light (i.e., the light of the first color) deflected at the preset angle, and do not perform wavelength conversion on the light (i.e., the light of the first color) deflected at the preset angle.

In these embodiments, the sub-pixels P included in the sub-pixel group P11 may emit white light. That is, in a case where the first color is blue, the second color may be red (or green), and the third color may be green (or red). In this case, at least the second material layer 16 of the first material layer 15 and the second material layer 16 included in the first sub-pixel P1 includes the first light conversion material, at least the second material layer 16 of the first material layer 15 and the second material layer 16 included in the second sub-pixel P2 includes the second light conversion material, and at least the second material layer 16 of the first material layer 15 and the second material layer 16 included in the third sub-pixel P3 includes the second scattering particles. That is, the first sub-pixel P1 is a red sub-pixel R (or a green sub-pixel G), the second sub-pixel P2 is a green sub-pixel G (or a red sub-pixel R), and the third sub-pixel P3 is a blue sub-pixel B. Alternatively, in the case where the first color is blue, the second color may be red (or green), and the fourth color may be green (or red). In this case, at least the second material layer 16 of the first material layer 15 and the second material layer 16 included in the first sub-pixel P1 includes the first light conversion material, at least the second material layer 16 of the first material layer 15 and the second material layer 16 included in the second sub-pixel P2 includes the first scattering particles, and at least the second material layer 16 of the first material layer 15 and the second material layer 16 included in the third sub-pixel P3 includes the third light conversion material. That is, the first sub-pixel P1 is a red sub-pixel R (or a green sub-pixel G), the second sub-pixel P2 is a blue sub-pixel B, and the third sub-pixel P3 is a green sub-pixel G (or a red sub-pixel R). Alternatively, in the case where the first color is blue, the second color may be cyan, the third color may be yellow, and the fourth color may be magenta. In this case, at least the second material layer 16 of the first material layer 15 and the second material layer 16 included in the first sub-pixel P1 includes the first light conversion material, at least the second material layer of the first material layer 15 and the second material layer 16 included in the second sub-pixel P2 includes the second light conversion material, and at least the second material layer of the first material layer 15 and the second material layer 16 included in the third sub-pixel P3 includes the third light conversion material. That is, the first sub-pixel is a cyan sub-pixel, the second sub-pixel is a yellow sub-pixel, and the third sub-pixel is a magenta sub-pixel.

In these embodiments, the light-emitting substrate 1 may be used for lighting and decoration, i.e., may be applied to a lighting apparatus. Alternatively, the light-emitting substrate 1 may be used for displaying an images or a screen, i.e., may be applied to a display apparatus, such as a full-color display apparatus.

In some embodiments, as shown in FIGS. 1G and 1H, the first sub-pixel P1, the second sub-pixel P2 and the third sub-pixel P3 are a red sub-pixel R, a green sub-pixel G and a blue sub-pixel B, respectively. In the sub-pixel group P11, an area of the at least one first sub-pixel P1 and an area of the at least one third sub-pixel P3 are each less than an area of the at least one second sub-pixel P2, and the area of the at least one first sub-pixel P1 is substantially equivalent to the area of the at least one third sub-pixel P3.

The area of the at least one first sub-pixel P1 is substantially equivalent to the area of the at least one third sub-pixel P3, which means that an area of an effective light-emitting region of the at least one first sub-pixel P1 and an area of an effective light-emitting region of the at least one third sub-pixel P3 are not much different from each other, and are not identical to each other. For example, a ratio of the area of the effective light-emitting region of the at least one first sub-pixel P1 to the area of the effective light-emitting region of the at least one third sub-pixel P3 may be 0.9:1.1.

In these embodiments, according to performance characteristics of the current quantum dot light-emitting materials, a light conversion efficiency of a red quantum dot light-emitting material is higher than a light conversion efficiency of a green quantum dot light-emitting material. Therefore, the area of the at least one first sub-pixel P1 and the area of the at least one third sub-pixel P3 are each less than the area of the at least one second sub-pixel P2, and the area of the at least one first sub-pixel P1 is substantially equivalent to the area of the at least one third sub-pixel P3, so that a brightness of green light in a pixel may be increased to some extent, thereby better realizing white balance matching.

In some embodiments, the first sub-pixel P1, the second sub-pixel P2 and the third sub-pixel P3 are a red sub-pixel R, a blue sub-pixel B and a green sub-pixel G, respectively. The area of the at least one first sub-pixel P1 and the area of the at least one second sub-pixel P2 are each less than the area of the at least one third sub-pixel P3, and the area of the at least one first sub-pixel P1 is substantially equivalent to the area of the at least one second sub-pixel P2.

The area of the at least one first sub-pixel P1 is substantially equivalent to the area of the at least one second sub-pixel P2, which means that the area of the effective light-emitting region of the at least one first sub-pixel P1 and an area of an effective light-emitting region of the at least one second sub-pixel P2 are not much different from each other, and are not identical to each other. For example, a ratio of the area of the effective light-emitting region of the at least one first sub-pixel P1 to the area of the effective light-emitting region of the at least one second sub-pixel P2 may be 0.9:1.1.

In these embodiments, similar to the case that the first sub-pixel P1, the second sub-pixel P2 and the third sub-pixel P3 are respectively the red sub-pixel R, the green sub-pixel G and the blue sub-pixel B, the reason for the above arrangements will not be repeated here.

In addition, in an actual application, the blue sub-pixel directly emits light through the light-emitting element 13. The red sub-pixel and the green sub-pixel need to adjust the brightness through light conversion, and have a light-emitting brightness less than that of the blue sub-pixel. Therefore, in order to further improve the white balance effect, in the sub-pixel group, a ratio of an area of an effective light-emitting region of the red sub-pixel to an area of an effective light-emitting region of the blue sub-pixel is greater than 1.

Here, the area of the effective light-emitting region of the red sub-pixel refers to a total area of effective light-emitting region(s) of all the red sub-pixel(s) in the sub-pixel group, and the area of the effective light-emitting region of the blue sub-pixel refers to a total area of effective light-emitting region(s) of all the blue sub-pixel(s) in the sub-pixel group.

In some embodiments, as shown in FIGS. 1G and 1H, in the sub-pixel group P11, there is a single red sub-pixel R and a single blue sub-pixel B, and the number of green sub-pixels G is two. Moreover, areas of the red sub-pixel R, the green sub-pixel G and the blue sub-pixel B are equal to each other. The sub-pixels P included in the sub-pixel group P11 are arranged in an array.

The areas of the red sub-pixel R, the green sub-pixel G and the blue sub-pixel B are equal to each other, but are not identical to each other. The areas of the red sub-pixel R, the green sub-pixel G and the blue sub-pixel B may have slight differences due to errors in manufacturing process, which may be understood here that the area of the red sub-pixel R, the area of the green sub-pixel G and the area of the blue sub-pixel B are equal to the same value in theoretical design.

That is, in these embodiments, the first material layers 15 in the sub-pixels P included in the sub-pixel group P11 have substantially the same coverage area, and are distributed regularly. The second material layers 16 in the sub-pixels P included in the sub-pixel group P11 have substantially the same coverage area, and are distributed regularly. This is conducive to simplifying the manufacturing process.

In some embodiments, as shown in FIGS. 1G and 1H, in the sub-pixel group P11, an area of the light exit surface 13*a* of the light-emitting element 13 included in each sub-pixel P is substantially the same, and the light-emitting elements 13 are arranged in an array.

The area of the light exit surface 13*a* of the light-emitting element 13 included in each sub-pixel P is substantially the same, and is not exactly the same. The area of the light exit surface 13*a* of the light-emitting element 13 included in each sub-pixel P may have a slight difference due to errors in manufacturing process, which may be understood here that the area of the light exit surface 13*a* of the light-emitting element 13 included in each sub-pixel P is equal to the same value in theoretical design.

In these embodiments, in a case where the light-emitting element 13 is the light-emitting diode, a large light-emitting diode may be cut into four equal portions to form four small light-emitting diodes, which may also simplify the cutting process.

In some embodiments, in the sub-pixel group P11, the two green sub-pixels G are located in different rows and columns.

In these embodiments, as shown in FIGS. 1G and 1H, compared with a case that the two green sub-pixels G are located in a same row or a same column, the two green sub-pixels G are respectively located at two diagonal positions of grid, so that the green sub-pixels G may be better distributed, and the color mixing effect and the white balance effect may be improved.

In some embodiments, as shown in FIGS. 1H, 1I and 1J, the light-emitting substrate 1 further includes black matrixes 17 disposed between the plurality of sub-pixels P.

That is, in these embodiments, in a case where the light-emitting substrate 1 emits color-adjustable light, the black matrixes 17 may prevent crosstalk between the plurality of sub-pixels P.

In some embodiments, as shown in FIGS. 1H and 1J, in the case where the substrate 11 serves as the first material layers 15, at least part of the black matrixes 17 are arranged in a same layer as the second material layers 16, and are each in contact with second material layers 16 included in two adjacent sub-pixels P. As shown in FIGS. 1H and 1I, in the case where the substrate 11 is disposed on the side of the first material layer 15 away from the light-emitting element 13, at least part of the black matrixes 17 are arranged in a same layer as an entirety of the first material layers 15 and the second material layers 16, and are each in contact with second material layers 16 and first material layers 15 included in two adjacent sub-pixels P.

In these embodiments, in the case where the substrate 11 serves as the first material layers 15, according to the fact that the plurality of sub-pixels P may emit light upward or downward, there may be two different cases. In a first case, the plurality of sub-pixels P emit light upward. In this case, as shown in FIGS. 1H and 1J, the black matrix 17 is disposed on a side of the first material layer 15 proximate to the light-emitting element 13. In the sub-pixel group P11, in an example where the portions, beyond the region where the first light extraction layers 14 included in the sub-pixels P are located, of the orthographic projections of the first material layers 15 included in the sub-pixels P on the plane where the pixel layer 12 is located surround the region where the light-emitting elements 13 included in the sub-pixels P are located, part of the black matrixes 17 are arranged in the same layer as the second material layers 16. The remaining part of the black matrixes 17 may be disposed on circuit wirings of the pixel driving circuits, and may be located on a side of the light-emitting element 13 away from the first material layer 15. In a second case, the plurality of sub-pixels P emit light downward. In this case, the black matrix 17 is disposed on the side of the first material layer 15 away from the light-emitting element 13, and all of the black matrixes 17 are arrange in the same layer as the second material layers 16.

In the case where the substrate 11 is disposed on the side of the first material layer 15 away from the light-emitting element 13, according to the fact that the plurality of sub-pixels P may emit light upward or downward, there may be two different cases. In a first case, the plurality of sub-pixels P emit light upward, and the black matrix 17 is disposed on a side of the substrate 11 proximate to the light-emitting element 13. In this case, as shown in FIGS. 1H and 1I, in the sub-pixel group P11, in an example where the portions, beyond the region where the first light extraction layers 14 included in the sub-pixels P are located, of the orthographic projections of the first material layers 15 included in the sub-pixels P on the plane where the pixel layer 12 is located surround the region where the light-emitting elements 13 included in the sub-pixels P are located, part of the black matrixes 17 are arranged in the same layer as the entirety of the first material layers 15 and the second material layers 16. The remaining part of the black matrixes 17 may be disposed on the circuit wirings of the pixel driving circuits, and may be located on the side of the light-emitting element 13 away from the first material layer 15. In a second case, the plurality of sub-pixels P emit light downward, and the black matrix 17 is disposed on the side of the first material layer 15 away from the light-emitting element 13. In this case, all of the black matrixes 17 are arranged in the same layer as the entirety of the first material layers 15 and the second material layers 16.

In these embodiments, in the case where the substrate 11 serves as the first material layers 15, the at least part of the black matrixes 17 are arranged in the same layer as the second material layers 16, and are each in contact with second material layers 16 included in two adjacent sub-pixels P, so that the black matrix 17 may absorb light emitted from second material layers 16 that are in contact with this black matrix 17, thereby avoiding crosstalk of light emitted from second material layers 16 included in two adjacent sub-pixels P. In the case where the substrate 11 is disposed on the side of the first material layer 15 away from the light-emitting element 13, the at least part of the black matrixes 17 are arranged in the same layer as the entirety of the first material layers 15 and the second material layers 16, and are each in contact with the first material layers 15 and the second material layers 16 included in the two adjacent sub-pixels P, so that the black matrix 17 may absorb light emitted from the first material layers 15 and the second material layers 16 that are in contact with this black matrix 17, thereby avoiding crosstalk of light emitted from a first material layer 15 and a second material layer 16 included in a sub-pixel P and light emitted from a first material layer 15 and a second material layer 16 included in an adjacent sub-pixel P.

In some embodiments, as shown in FIG. 1J, in the case where the substrate 11 serves as the first material layers 15, the light-emitting substrate 1 further includes second light extraction layer(s) 18 and light absorption pattern(s) 19. The second light extraction layer 18 and the light absorption pattern 19 are respectively disposed at positions corresponding to a reference pattern 171, and are located on a side of the first material layer 15 away from the reference pattern 171. The second light extraction layer 18 is configured to extract light propagating in the first material layer 15 and the second material layer 16 toward a side of the second light extraction layer 18 away from the first material layer 15. The light absorption pattern 19 is disposed on the side of the second light extraction layer 18 away from the first material layer 15, and is in contact with the second light extraction layer 18. The reference patterns 171 are the at least part of the black matrixes 17 arranged in the same layer as the second material layers 16.

In these embodiments, the second light extraction layer(s) 18 and the light absorption pattern(s) 19 are disposed, so that a light extraction pattern may be formed between two adjacent sub-pixels P, and may absorb the extracted light, thereby avoiding crosstalk of light emitted from two adjacent sub-pixels P in an optical waveguide layer (i.e., substrate 11).

In some embodiments, as shown in FIGS. 1H, 1I and 1J, in a case where the second surface 15*a* is the surface of the first material layer 15 away from the light-emitting element 13, and in the sub-pixel group P11, the portions, beyond the region where the first light extraction layers 14 included in the sub-pixels P are located, of the orthographic projections of the first material layers 15 included in the sub-pixels P on the plane where the pixel layer 12 is located surround the region where the light-emitting elements 13 included in the sub-pixels P are located, the pixel driving circuits 100 are disposed on the substrate 11. Part of the black matrixes 17 located between two adjacent sub-pixel groups P11 are arranged in the same layer as the first material layers 15 or the second material layers 16, or are arranged in the same layer as an entirety of the first material layers 15 and the second material layers 16. The remaining part of the black matrixes 17 include: a first portion 172 located between first material layers 15 or second material layers 16 included in two adjacent sub-pixels P in a same sub-pixel group P11, or located between an entirety of a first material layer 15 and a second material layer 16 included in a sub-pixel P of the two adjacent sub-pixels P and an entirety of a first material layer 15 and a second material layer 16 included in another sub-pixel P of the two adjacent sub-pixels P; and a second portion 173 located on circuit wirings between light-emitting elements 13 and pixel driving circuits 100 included in the two adjacent sub-pixels P in the same sub-pixel group P11.

In these embodiments, there are two possible cases. In a first case, as shown in FIGS. 1H and 1J, the substrate 11 serves as the first material layers 15. In this case, the part of the black matrixes 17 located between two adjacent sub-pixel groups P11 are arranged in the same layer as the second material layers 16, so that crosstalk of light emitted from second material layers 16 in a sub-pixel group P11 and light emitted from second material layers 16 in an adjacent sub-pixel group P11 may be avoided. The remaining part of the black matrixes 17 include the first portion 172 disposed between the second material layers 16 included in the two adjacent sub-pixels P in the same sub-pixel group P11, and the second portion 173 disposed on the circuit wirings between the light-emitting elements 13 and the pixel driving circuits 100 included in the two adjacent sub-pixels P in the same sub-pixel group P11. The first portion 172 may avoid crosstalk of light emitted from the two adjacent sub-pixels P in the same sub-pixel group P11. The second portion 173 may cover the circuit wirings between the light-emitting elements 13 and the pixel driving circuits 100 included in the two adjacent sub-pixels P in the same sub-pixel group P11. Of course, the black matrixes 17 may further cover the pixel driving circuits 100.

Here, in an example where the pixel driving circuit 100 is of a 7T1C structure, as shown in FIG. 1H, the pixel driving circuit 100 may include thin film transistors, and gate lines Gate, data lines Date, and voltage drain drain (VDD) lines that are all electrically connected to the thin film transistors. In this case, the black matrixes 17 may further cover the thin film transistors, the gate lines Gate, the data lines Date and the VDD lines, so as to cover the pixel driving circuits 100.

In a second case, as shown in FIGS. 1H and 1I, the substrate 11 is disposed on the side of the first material layer 15 away from the light-emitting element 13. In this case, the part of the black matrixes 17 located between two adjacent sub-pixel groups P11 may be arranged in the same layer as the first material layers 15 or the second material layers 16, or may be arranged in the same layer as the entirety of the first material layers 15 and the second material layers 16. In a case where the part of the black matrixes 17 located between two adjacent sub-pixel groups P11 are arranged in the same layer as the first material layers 15, crosstalk of light emitted from first material layers 15 in a sub-pixel group P11 and light emitted from first material layers 15 in an adjacent sub-pixel group P11 may be avoided. In a case where the part of the black matrixes 17 located between two adjacent sub-pixel groups P11 are arranged in the same layer as the second material layers 16, crosstalk of light emitted from second material layers 16 in a sub-pixel group P11 and light emitted from second material layers 16 in an adjacent sub-pixel group P11 may be avoided. In a case where the part of the black matrixes 17 located between two adjacent sub-pixel groups P11 are arranged in the same layer as the entirety of the first material layers 15 and the second material layers 16, crosstalk of light emitted from first material layers 15 in a sub-pixel group P11 and light emitted from first material layers 15 in an adjacent sub-pixel group P11 may be avoided, and crosstalk of light emitted from second material layers 16 in a sub-pixel group P11 and light emitted from second material layers 16 in an adjacent sub-pixel group P11 may be avoided. As shown in FIGS. 1H and 1I, the remaining part of the black matrixes 17 include: the first portion 172 disposed between the first material layers 15 or the second material layers 16 included in the two adjacent sub-pixels P in the same sub-pixel group P11, or disposed between the entirety of the first material layer 15 and the second material layer 16 included in the sub-pixel P of the two adjacent sub-pixels P and the entirety of the first material layer 15 and the second material layer 16 included in the another sub-pixel P of the two adjacent sub-pixels P; and the second portion 173 disposed on the circuit wirings between the light-emitting elements 13 and the pixel driving circuits 100 included in the two adjacent sub-pixels P in the same sub-pixel group P11. In a case where the first portion 172 is arranged in a same layer as first material layers 15 included in two adjacent sub-pixels P included in a same sub-pixel group P11, the first portion 172 may avoid crosstalk of light emitted from the first material layers 15 included in the two adjacent sub-pixels P in the same sub-pixel group P11. In a case where the first portion 172 is arranged in a same layer as second material layers 16 included in two adjacent sub-pixels P included in a same sub-pixel group P11, the first portion 172 may avoid crosstalk of light emitted from the second material layers 16 included in the two adjacent sub-pixels P in the same sub-pixel group P11. In a case where the first portion 172 is arranged in a same layer as an entirety of first material layers 15 and second material layers 16 included in two adjacent sub-pixels P in a same sub-pixel group P11, the first portion 172 may avoid crosstalk of light emitted from first material layers 15 included in two adjacent sub-pixels P in a same sub-pixel group P11, and may avoid crosstalk of light emitted from second material layers 16 included in two adjacent sub-pixels P included in a same sub-pixel group P11. The second portion 173 may cover the circuit wirings disposed between the light-emitting elements 13 and the pixel driving circuits 100 included in the two adjacent sub-pixels P in the same sub-pixel group P11.

In this case, the black matrixes 17 may also cover the pixel driving circuits 100, which will not be repeated here.

In some embodiments, as shown in FIGS. 1I and 1J, the second portion 173 is disposed on the side of the light-emitting element 13 away from the first material layer 15.

In these embodiments, as shown in FIGS. 1I and 1J, the second portion 173 may be arranged in a same layer as the reflective layer 134 in the light-emitting element 13, and may cover an electrical connection line (e.g., copper line) between the second electrode 132 of the light-emitting element 13 and the pixel driving circuit 100.

In some embodiments, as shown in FIGS. 1A to 1F, the first light extraction layer 14 includes a lens structure 141 and a grating structure 142 disposed on a side of the lens structure 141 away from the light-emitting element 13. A surface of the grating structure 142 away from the light-emitting element 13 is the first surface 14*a*. The lens structure 141 is configured to collimate the light emitted from the light-emitting element 13. The grating structure 142 is configured to deflect light emitted from the lens structure 141, so as to deflect the light emitted from the light-emitting element 13 into the first material layer 15 at the preset angle.

An optical device composed of a large number of parallel slits of equal width and equal interval is referred to as a grating. The grating structure 141 may be formed on the first material layer 15. For example, a large number of parallel notches are carved on the first material layer 15, and the notches are opaque portions. A smooth portion between two notches may transmit light, and is equivalent to a slit, thereby forming the grating structure 141. Alternatively, the grating structure 141 may be obtained by manufacturing a plurality of slits on a metal sheet.

Monochromatic parallel light is diffracted by each slit of the grating, and is interfered by the slits of the grating to form a pattern with wide dark fringes and fine bright fringes. These fine bright fringes are referred to as spectral lines.

A position of the spectral lines generated by the diffraction grating on a screen (which refers to the first material layer 15 herein) may be expressed by the formula $(a+b)(\sin\varphi\pm\sin\theta)=k\lambda$. In the formula, a represents a width of the slit, b represents an interval between the slits, $\varphi$ is a diffraction angle, $\theta$ is an included angle between an incident direction of light and a normal of a grating plane, k is a spectral order of the bright fringes ($k=0, \pm1, \pm2 \ldots$), $\lambda$ is a wavelength, and (a+b) may be expressed by d, which is referred to as a grating constant.

It can be seen from the grating equation $d(\sin\varphi\pm\sin\theta)=k\lambda$ that for a same spectral order k, mixed light composed of light with different wavelengths such as $\lambda1$, $\lambda2$, $\lambda3$ . . . is incident on the grating at a same incident angle $\theta$, and interference maxima generated by light with each wavelength is located at a different angular position. That is, diffracted light with different wavelengths exits at different diffraction angles $\varphi$.

In this way, in a case where A is constant, by adjusting parameters of the grating structure 142 such as the grating constant d and a duty cycle, light with a wavelength $\lambda$ may be incident into the first material layer 15 at a certain angle (i.e., the preset angle) under a condition that the spectral order k and the incident angle $\theta$ are constant.

In some embodiments, the duty cycle of the grating structure 142 is in a range of 0.4 to 0.6, inclusive. In an example where the grating structure 142 is a transmission grating, the duty cycle is a ratio of an area of a light-transmitting portion to an area of a non-light-transmitting portion. The duty cycle within this range is more conducive to manufacturing the grating structure 142.

In some embodiments, the grating structure 142 is a zero-order eliminating grating, a tilted grating or a blazed grating.

The zero-order eliminating grating refers to a grating that eliminates zero-order diffraction spectral points, and is the most traditional grating structure 141. The tilted grating is widely used due to its high efficiency in specific diffraction orders. The blazed grating, also referred to as echelette, is a specific reflective or transmissive diffraction grating structure that produces a maximum diffraction efficiency in a specific diffraction order.

Figure 1L:
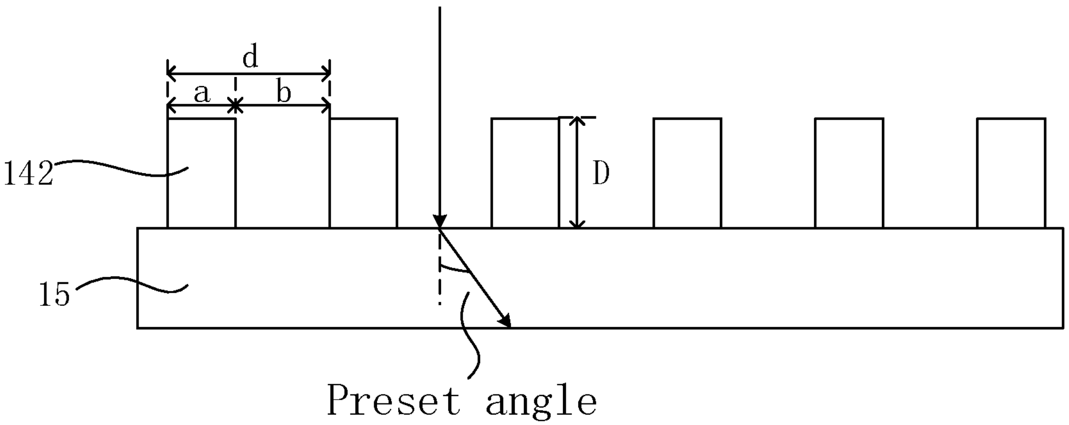
FIG. 1L is a structural diagram of a grating structure, in accordance with some embodiments.

In some embodiments, as shown in FIG. 1L, in a case where the grating structure 142 is the zero-order eliminating grating, the grating constant d of the grating structure 142 is 410 nm, and the thickness D of the grating structure 142 is 280 nm.

In an example where the substrate 11 is made of glass, in the case where the substrate 11 serves as the first material layers 15, according to the refractive index of the substrate 11 and the refractive index of air, it can be known that a minimum incident angle (i.e., the preset angle), for realizing the total reflection of the light emitted from the light-emitting element 13 at the interface between the first material layer 15 and the dielectric layer located on the side of the first material layer 15 away from the second material layer 16 and the total reflection of the light entering the second material layer 16 at the interface between the second material layer 16 and the dielectric layer located on the side of the second material layer 16 away from the first material layer 15, is 36 degrees. Through simulation, it can be obtained that in the case where the grating structure is the zero-order eliminating grating, i.e., in a case where the thickness D of the grating 142 is 280 nm, and the grating constant is 410 nm, diffraction efficiencies of ±1 orders are maximized at an incident angle (i.e., preset angle) of 40 degrees, and are 33% respectively, and an overall diffraction efficiency (i.e., a sum of diffraction efficiencies of all orders) may reach 66%.

In some embodiments, as shown in FIG. 1M, in a case where the grating structure 142 is the tilted grating, the tilted grating has a grating constant of 410 nm, a thickness of 450 nm, and a tilt angle of 20 degrees.

In these embodiments, through simulation, it can be obtained that in the case where the grating structure is the tilted grating, i.e., in a case where the grating structure has the thickness of 450 nm, the grating constant of 410 nm, and the tilt angle of 20 degrees, the diffraction efficiency of the grating structure reaches a maximum, and is about 62%.

In some other embodiments, as shown in FIG. 1N, in a case where the grating structure 142 is the blazed grating, the blazed grating has a grating constant of 480 nm and a blaze angle of 35 degrees.

The grating constant is a step period. In an example where the step period has four steps, the grating constant is a dimension of the four steps along an arrangement direction of the steps. The blaze angle is an included angle between an inclined plane of the steps (i.e., a plane perpendicular to the paper plane and on which a connection line of vertexes of the steps is located as shown in FIG. 1N) and a plane where the grating structure 142 is located. By selecting the blaze angle, a diffraction angle of light of a specific order may be adjusted, so that the incident angle (i.e., the preset angle) of the light may be adjusted.

It is obtained through simulation that in a case where a 1st order diffraction angle (i.e., a diffraction angle of 1st order light) is 70 degrees, d is equal to 0.48 um (d=0.48 um), and in this case, the blaze angle is about 35 degrees. The grating structure 142 that is the blazed grating has a lower diffraction efficiency than the grating structure 142 that is the zero-order eliminating grating or the tilted grating.

In some embodiments, as shown in FIG. 1O, a refractive index of the lens structure 141 is in a range of 1.4 to 1.5, inclusive. Moreover, an arch height h of the lens structure 141 is ⅓ times an aperture w of the lens structure 141, and a distance G between the lens structure 141 and the grating structure 142 is greater than or equal to 0 nm and less than or equal to 200 nm.

The distance G between the lens structure 141 and the grating structure 142 is a distance between a lowest point (i.e., a lowest point of an arch proximate to the grating structure 142) of the lens structure 141 and a highest point (i.e., a point of the grating structure 142 having a largest vertical distance from the second surface 15*a* of the first material layer 15 along the thickness direction of the first material layer 15) of the grating structure 142. In a case where the distance G between the lens structure 141 and the grating structure 142 is equal to 0 nm, the lens structure 141 is in contact with the grating structure 142.

In these embodiments, the lens structure 141 is used for collimating and converging light of lambertian distribution emitted from the LED to a certain degree, and has good collimating and converging effects for light within a range of −60 degrees to 60 degrees relative to the normal of the light exit surface.

In some embodiments, as shown in FIG. 1O, the light-emitting substrate 1 further includes transparent material layers 143 each filled between the grating structure 142 and the lens structure 141. A refractive index of the transparent material layer 143 is in a range of 1.2 to 1.3, inclusive.

In these embodiments, the transparent material layer 143 may function to fix the lens structure 141. By selecting the transparent material layer with the refractive index of 1.2 to 1.3, i.e., by selecting the transparent material layer with a low refractive index, the refractive index of the transparent material layer 143 is close to a vacuum refractive index (about 1), so that a good deflection effect may be realized by using the above parameters of the grating structure 142. That is, a high diffraction efficiency may be maintained by using the grating structure 142 obtained by simulation.

In some embodiments, the light-emitting substrate 1 further includes a filter film and/or an antireflection film. The filter film is disposed on a side of the second material layers 16 facing the second surfaces 15*a*, and/or the antireflection film is disposed on the side of the second material layers 16 facing the second surfaces 15*a*. The filter film includes filter units each disposed in a sub-pixel P. The filter unit is configured to allow light with a first wavelength to pass therethrough, and to absorb light with a second wavelength. The light with the first wavelength is light emitted from a sub-pixel where the filter unit is located. The light with the second wavelength is light with other bands except the first wavelength in visible light bands.

For example, in an example where the light-emitting substrate 1 includes red sub-pixels R, green sub-pixels G and blue sub-pixels B, the filter film may include filter units each located in a red sub-pixel R, filter units each located in a green sub-pixel G, and filter units each located in a blue sub-pixel B. Moreover, the filter unit located in the red sub-pixel R may be a red filter unit, the filter unit located in the green sub-pixel G may be a green filter unit, and the filter unit located in the blue sub-pixel B may be a blue filter unit.

In these embodiments, the filter unit may function to reflect external light, thereby reducing the reflection of the external light by the light-emitting substrate 1. The antireflection film is also referred to as an antireflection coating, and may reduce or eliminate reflected light on a surface of an optical element such as a lens or a plane mirror, thereby increasing a light transmission amount of the optical element. Here, the antireflection film may reduce the reflection of the external light by the light-emitting substrate, so that display and viewing effects may be improved, and false excitation of the quantum dot light-emitting material caused by the external light may be avoided.

In some embodiments, the antireflection film may be a circular polarizer.

Some embodiments of the present disclosure provide a manufacturing method of a light-emitting substrate, and the manufacturing method includes a following step.

A pixel layer 12 is formed. The pixel layer 12 includes a plurality of sub-pixels P. Each sub-pixel P includes a light-emitting element 13, a first light extraction layer 14 disposed on a side of the light-emitting element 13 where a light exit surface 13*a* of the light-emitting element 13 is located, a first material layer 15 disposed on a side of the first light extraction layer 14 where a first surface 14*a* of the first light extraction layer 14 is located, and a second material layer 16 that is in contact with a surface of the first material layer 15 opposite to a second surface 15*a* of the first material layer 15. The light-emitting element 13 is configured to emit light of a first color. The first light extraction layer 14 is configured to deflect the light emitted from the light-emitting element 13 into the first material layer 15 at a preset angle. The first material layer 15 and the second material layer 16 are configured to enable the light deflected at the preset angle to propagate in the first material layer 15 and the second material layer 16. The first surface 14*a* is a surface of the first light extraction layer 14 away from the light-emitting element 13. The second surface 15*a* is a surface of the first material layer 15 proximate to or away from the light-emitting element 13. The plurality of sub-pixels P include at least one first sub-pixel P1. Of a first material layer 15 and a second material layer 16 included in the at least one first sub-pixel P1, at least the second material layer 16 includes a first light conversion material. The first light conversion material is configured to absorb light propagating in a first material layer 15 and a second material layer 16 included in a first reference sub-pixel, and to convert the absorbed light into emergent light of a second color. The first reference sub-pixel is a first sub-pixel P1 to which the first light conversion material belongs.

In some embodiments, the light-emitting substrate further includes a substrate 11, and pixel driving circuits 100 are provided on the substrate 11. The substrate 11 serves as first material layers 15 in the plurality of sub-pixels P, and forming the pixel layer 12, includes: forming first light extraction layers 14 in the plurality of sub-pixels P on the substrate 11; forming second material layers 16 in the plurality of sub-pixels P on the substrate; and forming light-emitting elements 13 in the plurality of sub-pixels P on the substrate 11. Alternatively, the second surface 15*a* is the surface of the first material layer 15 away from the light-emitting element, and the substrate is disposed on a side of the first material layer 15 away from the light-emitting element 13. Forming the pixel layer 12, includes: forming the first material layers 15 on the substrate 11; forming the first light extraction layers 14 on the substrate 11; forming the second material layers 16 on the substrate 11; and forming the light-emitting elements 13 on the substrate 11.

In some embodiments, forming the first material layers 15 on the substrate 11, may include: forming the first material layers 15 by a photolithography or printing process. For example, the first material layer 15 may include a transparent substrate layer and the first light conversion material dispersed in the transparent substrate layer. Alternatively, the first material layer 15 includes only the transparent substrate layer.

Forming the second material layers 16 on the substrate, may include: forming the second material layers 16 by a photolithography or printing process. For example, the second material layer 16 may include a transparent substrate layer and the first light conversion material dispersed in the transparent substrate layer. Alternatively, the second material layer 16 includes only the transparent substrate layer.

In some embodiments, the first light extraction layer 14 includes a lens structure 141 and a grating structure 142 disposed on a side of the lens structure 141 away from the light-emitting element 13. Forming the first light extraction layers 14 on the substrate 11, may include following steps.

Grating structures 142 in the first light extraction layers 14 are formed on the substrate 11.

For example, the grating structures 142 may be formed on the substrate 11 by nanoimprint. The grating structures 142 may be made of a metal material.

Lens structures 141 in the first light extraction layers 14 are formed on the substrate 11 on which the grating structures 142 are formed.

In this case, in a case where the light-emitting elements 13 are first light-emitting diodes, there are two possible cases. In a first case, there is no filling between the lens structure 141 and the grating structure 142. In this case, forming the lens structures 141 on the substrate 11 on which the grating structures are formed, includes following steps.

Before a plurality of second light-emitting diodes are transferred onto the substrate 11, the lens structures 141 are respectively formed on sides of the first light-emitting diodes where light exit surfaces of the first light-emitting diodes are respectively located. The lens structures 141 and the second light-emitting diodes are transferred onto the substrate 11 synchronously.

In a second case, a transparent material layer 143 is filled between the lens structure 141 and the grating structure 142. In this case, forming the lens structures 141 on the substrate 11 on which the grating structures are formed, includes following steps.

Before the plurality of second light-emitting diodes are transferred onto the substrate 11, transparent material layers 143 each are formed on the substrate 11 and in a region where the grating structure 142 is located. The lens structures 141 each are formed on a side of the transparent material layer 143 away from the grating structure 142 by coining. A refractive index of the transparent material layer 143 is in a range of 1.2 to 1.3, inclusive.

In these embodiments, the transparent material layers 143 may be made of a transparent adhesive (e.g., optical clear adhesive, OCA). The lens structure 141 may be formed on the side of the transparent material layer away from the grating structure 142 by roller coining.

In some embodiments, the plurality of sub-pixels P further include at least one second sub-pixel P2. The light-emitting substrate 1 has a plurality of pixel regions Q. The plurality of sub-pixels P constitute at least one sub-pixel group P11, and a sub-pixel group P11 is located in a pixel region Q. The sub-pixel group P11 includes at least one first sub-pixel P1 and at least one second sub-pixel P2. In the sub-pixel group P11, the light-emitting elements 13 included in the sub-pixels P are all the first light-emitting diodes, and have the same light-emitting color. The first light-emitting diodes included in the sub-pixel group P11 include a first electrode 131 and second electrodes 132, and a semiconductor layer 133 disposed between the first electrode 131 and the second electrodes 132. The light-emitting elements 13 included in the sub-pixels P share the same first electrode 131. Forming the light-emitting elements 13 on the substrate 11, includes following steps.

In S1, the plurality of second light-emitting diodes are manufactured. Each second light-emitting diode includes a plurality of first light-emitting diodes, and the plurality of first light-emitting diodes include a first electrode 131, second electrodes 132, and a semiconductor layer 133 formed between the first electrode 131 and the second electrodes 132. Moreover, the plurality of first light-emitting diodes share the same first electrode 131.

Here, in an example where the first light-emitting diode is a vertical LED, as shown in FIGS. 1P to 1S, manufacturing the plurality of second light-emitting diodes, may include following steps.

Figure 1P:
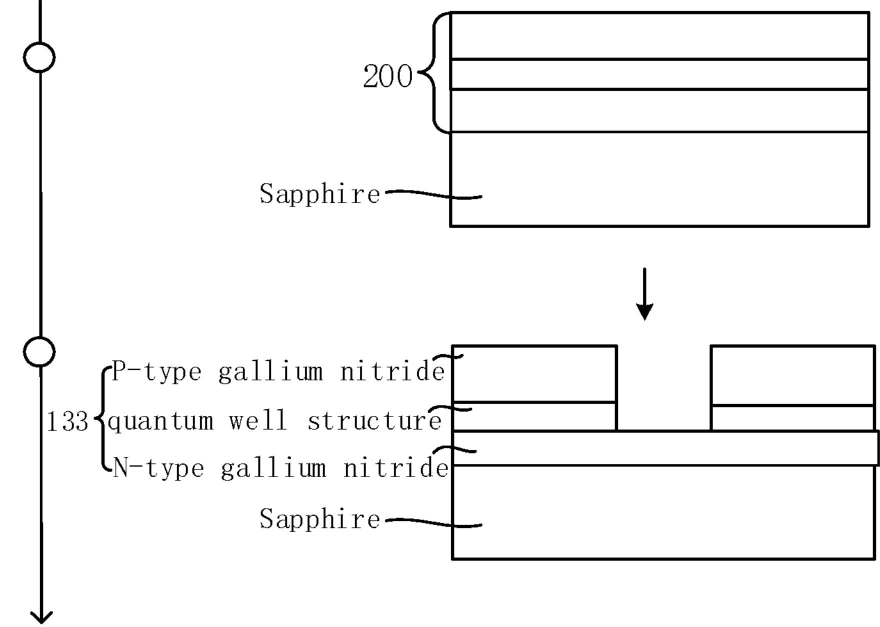
FIG. 1P is a flow diagram of cutting a semiconductor thin film, in accordance with some embodiments.

In S11, as shown in FIG. 1P, a semiconductor thin film 200 is manufactured on sapphire by an epitaxial process.

The semiconductor thin film 200 may include an N-type gallium nitride thin film, a P-type gallium nitride thin film and a quantum well thin film.

Of course, a buffer layer 300 may be formed on the sapphire.

In S12, as shown in FIG. 1P, parts, each located in a region where a second light-emitting diode is located, of the semiconductor thin film 200 are cut, so that parts, each located in a region where a second light-emitting diode is located, of an entirety of the P-type gallium nitride thin film and the quantum well thin film included in the semiconductor thin film 200 are cut into a plurality of semiconductor portions, and each semiconductor portion belongs to a first light-emitting diode.

In an example where a region where each second light-emitting diode is located is a rectangular region, and each sub-pixel group P11 includes four light-emitting elements 13, cutting the parts, each located in the region where the second light-emitting diode is located, of the entirety of the P-type gallium nitride thin film and the quantum well thin film included in the semiconductor thin film, may include following steps.

The region where each second light-emitting diode is located is divided into a plurality of regions. For example, the rectangular region may be divided into four small rectangular regions.

Part(s), located between the plurality of regions, of the entirety of the P-type gallium nitride thin film and the quantum well thin film included in the semiconductor thin film 200 are cut, so that the entirety of the P-type gallium nitride thin film and the quantum well thin film included in the semiconductor thin film are disconnected between the plurality of regions, and the semiconductor portion of each first light-emitting diode may be obtained.

For example, the entirety of the P-type gallium nitride thin film and the quantum well thin film included in the semiconductor thin film 200 may be etched by an inductively coupled plasma (ICP) etching process, so as to cut the part(s), located between the plurality of regions, of the entirety of the P-type nitride thin film and the quantum well thin film included in the semiconductor thin film 200. In this process, the gallium nitride thin film is etched by using a mixed gas mainly containing $SiCl_4$, and both physical process(s) and chemical reaction(s) exist in the etching process.

Figure 1Q:
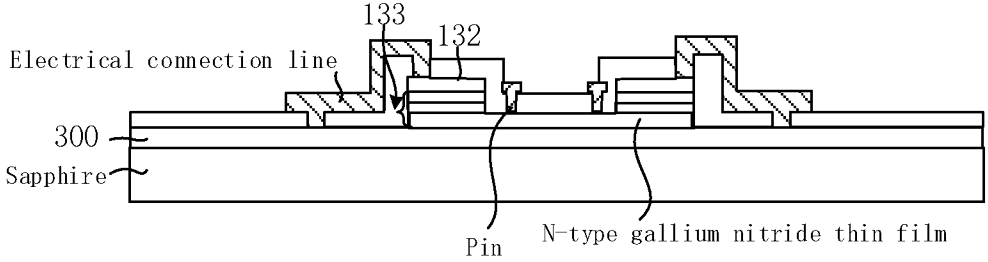
FIG. 1Q is a structural diagram showing second electrodes formed on sapphire, in accordance with some embodiments.
Figure 1R:
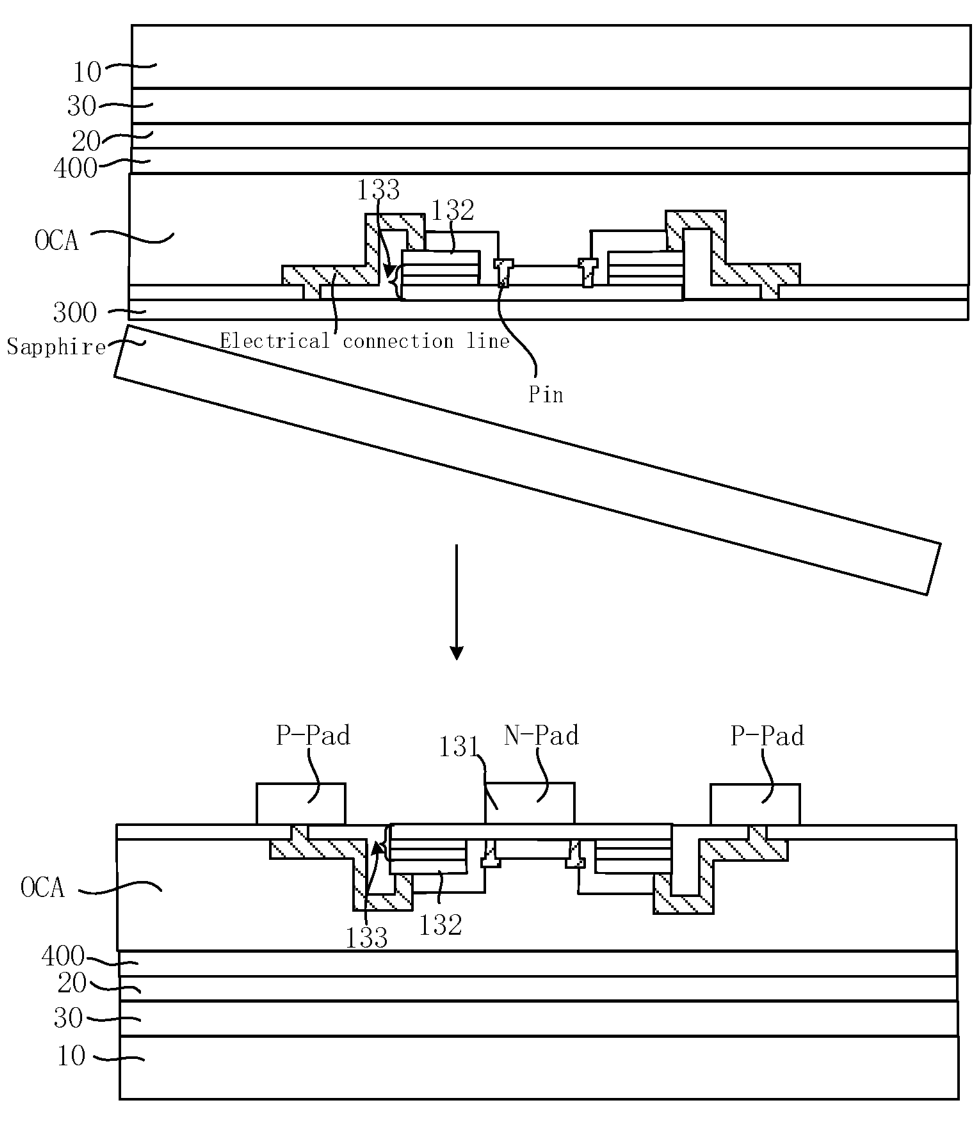
FIG. 1R is a structural diagram showing peeling of sapphire and formation of a temporary substrate, in accordance with some embodiments.

In S13, as shown in FIGS. 1Q and 1R, each second electrode 132 is formed on a semiconductor portion by a patterning process, and the first electrodes each are formed on part, located in a region where a second light-emitting diode is located, of the N-type gallium nitride thin film included in the semiconductor thin film 200.

For example, the first electrodes 131 may be N-Pads, i.e., first pads. The second electrodes 132 may be transparent electrodes. In this case, pins may be formed on the N-type gallium nitride thin film, and the N-type gallium nitride thin film may be electrically connected to the first pads through the pins. Each first light-emitting diode further includes a second pad (e.g., P-Pad) connected to the second electrode 132, and the second pad may be electrically connected to the second electrode 132 through an electrical connection line.

In a case where the first electrode 131 is closer to the first material layer 15 than the second electrode 132, forming each second electrode 132 on the semiconductor portion by the patterning process, and forming the first electrodes 131 each on the part, located in the region where the second light-emitting diode is located, of the N-type gallium nitride thin film included in the semiconductor thin film, may include following steps. As shown in FIG. 1Q, firstly, the second electrodes 132 are formed on a side of the semiconductor layers 133 away from the sapphire, the electrical connection lines each for electrically connecting the second electrode 132 and the second pad are formed, and the pins are formed on the part, located in the region where the second light-emitting diode is located, of the N-type gallium nitride thin film. Then, as shown in FIG. 1R, a temporary substrate 10 is formed on a side of the second electrodes 132 away from the semiconductor layers 133 (for example, the temporary substrate 10 may be adhered to the side of the second electrodes 132 away from the semiconductor layers 133 through an adhesive layer 30 and a release layer 20), and the sapphire is peeled off. Next, under the support of the temporary substrate 10, the first electrodes 131 (i.e., the first pads) are formed on a side of the semiconductor layers 133 away from the temporary substrate 10. The first electrode 131 is connected to the pins, so that the part, located in the region where the second light-emitting diode is located, of the N-type gallium nitride thin film is electrically connected to the first electrode 131. In this process, the second pads may be formed synchronously, and the second pad is electrically connected to the electrical connection line.

Figure 1S:
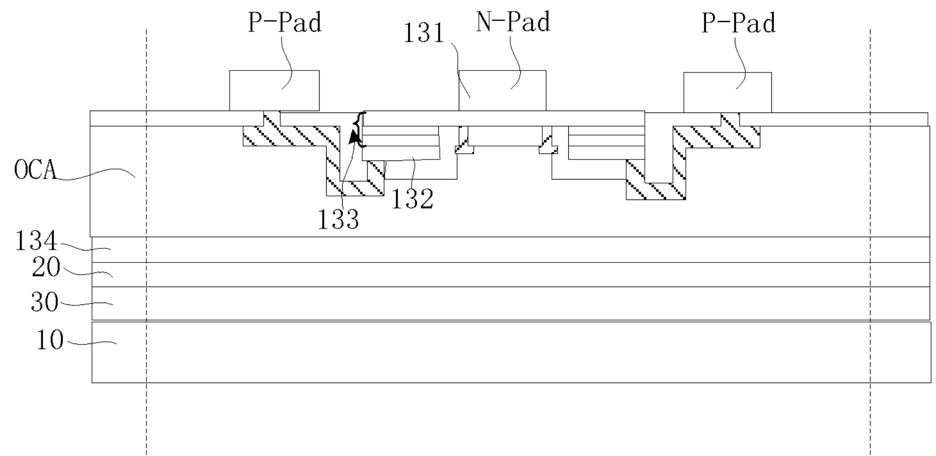
FIG. 1S is a structural diagram showing a plurality of second light-emitting diodes obtained by cutting a semiconductor structure, in accordance with some embodiments.

In S14, as shown in FIG. 1S, the structure in which the first electrodes 131 and the second electrodes 132 are formed is cut into the plurality of second light-emitting diodes.

Part(s), located between regions where the plurality of second light-emitting diodes are respectively located, of the structure in which the first electrodes 131 and the second electrodes 132 are formed may be cut to obtain the plurality of second light-emitting diodes.

In the process of forming the first electrode 131 and the second electrodes 132 on the semiconductor layer 133 by the patterning process, in order to improve a light utilization efficiency of the light-emitting element 13, as shown in FIG. 1R, before the sapphire is peeled off, a reflective film 400 may be formed on the side of the second electrodes 132 away from the semiconductor layers 133.

The reflective film 400 may be fixed to the side of the second electrodes 132 away from the semiconductor layers 133 through the optical clear adhesive (OCA).

In S2, the plurality of second light-emitting diodes are transferred onto the substrate 11, and the first light-emitting diodes included in each second light-emitting diode are electrically connected to respective pixel driving circuits 100 on the substrate 11 through the first electrode 131 and respective second electrodes 132.

Figure 1T:
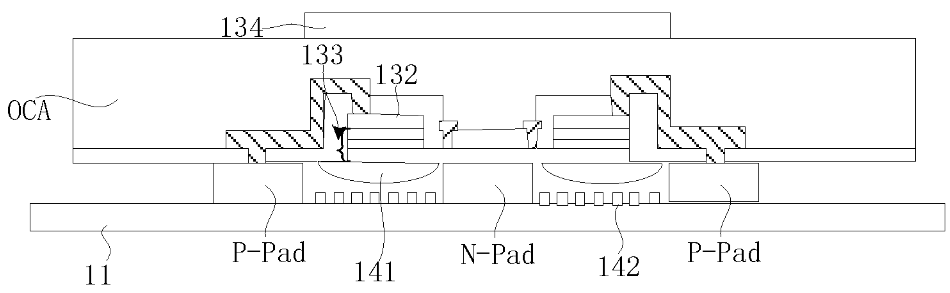
FIG. 1T is a structural diagram showing a plurality of second light-emitting diodes transferred onto a substrate, in accordance with some embodiments.

That is, as shown in FIG. 1T, after the second light-emitting diodes are transferred onto the substrate 11, the plurality of first light-emitting diodes may be respectively electrically connected to the pixel driving circuits through the first pad (N-Pad) and respective second pads (P-Pad).

After the second light-emitting diodes are transferred onto the substrate 11, the reflective film 400 may be patterned to obtain reflective layers 134 each covering at least a region where light exit surfaces of the plurality of first light-emitting diodes are located.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:

a pixel layer including a plurality of sub-pixels; wherein each sub-pixel includes a light-emitting element, a first light extraction layer disposed on a side of the light-emitting element where a light exit surface of the light-emitting element is located, a first material layer disposed on a side of the first light extraction layer where a first surface of the first light extraction layer is located, and a second material layer that is in contact with a surface of the first material layer opposite to a second surface of the first material layer; the light-emitting element is configured to emit light of a first color; the first light extraction layer is configured to deflect the light emitted from the light-emitting element into the first material layer at a preset angle; and the first material layer and the second material layer are configured to enable the light deflected at the preset angle to propagate in the first material layer and the second material layer; wherein the first surface is a surface of the first light extraction layer away from the light-emitting element; and the second surface is a surface of the first material layer proximate to or away from the light-emitting element; and the plurality of sub-pixels include at least one first sub-pixel; of a first material layer and a second material layer included in a first reference sub-pixel, at least the second material layer includes a first light conversion material; the first light conversion material is configured to absorb light propagating in the first material layer and the second material layer included in the first reference sub-pixel, and to convert the absorbed light into emergent light of a second color; and the first reference sub-pixel is a first sub-pixel from the at least one first sub-pixel;

wherein in each sub-pixel, in a case where the second surface is the surface of the first material layer away from the light-emitting element, an area of an orthographic projection of the first material layer on a plane where the pixel layer is located is greater than an area of an orthographic projection of the first light extraction layer on the plane where the pixel layer is located, and the second material layer is disposed on a portion, beyond a region where the first light extraction layer is located, of a surface of the first material layer facing the light-emitting element; or in a case where the second surface is the surface of the first material layer proximate to the light-emitting element, an area of an orthographic projection of the first material layer on a plane where the pixel layer is located is greater than or equal to an area of an orthographic projection of the first light extraction layer on the plane where the pixel layer is located, and the second material layer is disposed on the surface of the first material layer away from the light-emitting element.

2. The light-emitting substrate according to claim 1, further comprising a substrate; wherein in each sub-pixel, the substrate serves as the first material layer;

or the second surface is the surface of the first material layer away from the light-emitting element; and the substrate is disposed on a side of the first material layer away from the light-emitting element, and is in contact with the first material layer.

3. The light-emitting substrate according to claim 2, wherein the plurality of sub-pixels further include at least one second sub-pixel; of a first material layer and a second material layer included in a second reference sub-pixel, at least the second material layer includes a second light conversion material, and the second light conversion material is configured to absorb light propagating in the first material layer and the second material layer included in the second reference sub-pixel, and to convert the absorbed light into emergent light of a third color, and the second reference sub-pixel is a second sub-pixel from the at least one second sub-pixel; or of a first material layer and a second material layer included in a second reference sub-pixel, at least the second material layer includes first scattering particles, and the first scattering particles are configured to scatter light propagating in the first material layer and the second material layer included in the second reference sub-pixel, and the second reference sub-pixel is another second sub-pixel from the at least one second sub-pixel; and the light-emitting substrate has a plurality of pixel regions; the plurality of sub-pixels constitute at least one sub-pixel group, and a sub-pixel group in the at least one sub-pixel group is located in a pixel region in the plurality of pixel regions; the sub-pixel group includes sub-pixels, and the sub-pixels included in the sub-pixel group include at least one first sub-pixel and at least one second sub-pixel; wherein in the sub-pixel group, light-emitting elements included in the sub-pixels are first light-emitting diodes, and have a same light-emitting color; the first light-emitting diodes include a first electrode, second electrodes, and a semiconductor layer disposed between the first electrode and the second electrodes; and the light-emitting elements included in the sub-pixels share the same first electrode.

4. The light-emitting substrate according to claim 3, wherein the first light-emitting diodes are vertical light-emitting diodes, and the first electrode is closer to the first material layer in each sub-pixel than the second electrodes; and/or in the sub-pixel group, an area of an orthographic projection of a first material layer included in each sub-pixel of the sub-pixels on a plane where the pixel layer is located is greater than an area of an orthographic projection of a first light extraction layer included in the sub-pixel on the plane where the pixel layer is located, and portions, beyond a region where first light extraction layers included in the sub-pixels are located, of orthographic projections of first material layers included in the sub-pixels on the plane where the pixel layer is located surround a region where the light-emitting elements included in the sub-pixels are located; and/or the first light-emitting diodes further include a reflective layer disposed on a side of the first light-emitting diodes away from light exit surfaces of the first light-emitting diodes and covering at least a region where the light exit surfaces are located.

5. The light-emitting substrate according to claim 3, wherein the sub-pixel group further includes at least one third sub-pixel; of a first material layer and a second material layer included in a third reference sub-pixel, at least the second material layer includes a third light conversion material, and the third light conversion material is configured to absorb light propagating in the first material layer and the second material layer included in the third reference sub-pixel, and to convert the absorbed light into emergent light of a fourth color, and the third reference sub-pixel is a third sub-pixel from the at least one third sub-pixel; or of a first material layer and a second material layer included in a third reference sub-pixel, at least the second material layer includes second scattering particles, and the second scattering particles are configured to scatter light propagating in the first material layer and the second material layer included in the third reference sub-pixel, and the third reference sub-pixel is another third sub-pixel from the at least one third sub-pixel; wherein the second color, the third color and the fourth color are three primary colors, respectively; or the second color, the first color and the fourth color are three primary colors, respectively; or the second color, the third color and the first color are three primary colors, respectively.

6. The light-emitting substrate according to claim 5, wherein in the sub-pixel group, the at least one first sub-pixel is a red sub-pixel, the at least one second sub-pixel is a green sub-pixel, and the at least one third sub-pixel is a blue sub-pixel; and in the sub-pixel group, an area of the at least one first sub-pixel and an area of the at least one third sub-pixel are each less than an area of the at least one second sub-pixel, and the area of the at least one first sub-pixel is equivalent to the area of the at least one third sub-pixel; or the at least one first sub-pixel is a red sub-pixel, the at least one second sub-pixel is a blue sub-pixel, and the at least one third sub-pixel is a green sub-pixel; and an area of the at least one first sub-pixel and an area of the at least one second sub-pixel are each less than an area of the at least one third sub-pixel, and the area of the at least one first sub-pixel is equivalent to the area of the at least one second sub-pixel.

7. The light-emitting substrate according to claim 6, wherein in the sub-pixel group, a single red sub-pixel and a single blue sub-pixel exist, and a number of green sub-pixels is two; and areas of the red sub-pixel, the blue sub-pixel and a green sub-pixel in the two green sub-pixels are equal, and the sub-pixels included in the sub-pixel group are arranged in an array; or in the sub-pixel group, the red sub-pixel and the blue sub-pixel exist, and a number of green sub-pixels is two; areas of the red sub-pixel, the blue sub-pixel and the green sub-pixel are equal, and the sub-pixels included in the sub-pixel group are arranged in an array; and the two green sub-pixels are located in different rows and columns.

8. The light-emitting substrate according to claim 3, further comprising black matrixes disposed between the plurality of sub-pixels; wherein in a case where the second surface is the surface of the first material layer in each sub-pixel away from the light-emitting element, and in the sub-pixel group, portions, beyond a region where first light extraction layers included in the sub-pixels are located, of orthographic projections of first material layers included in the sub-pixels on a plane where the pixel layer is located surround a region where the light-emitting elements included in the sub-pixels are located, pixel driving circuits are further disposed on the substrate;

part of the black matrixes located between two adjacent sub-pixel groups are arranged in a same layer as first material layers or second material layers in the plurality of sub-pixels, or are arranged in a same layer as an entirety of first material layers and second material layers; and a remaining part of the black matrixes include: a first portion located between first material layers or second material layers included in two adjacent sub-pixels in a same sub-pixel group, or located between an entirety of a first material layer and a second material layer included in a sub-pixel of two adjacent sub-pixels and an entirety of a first material layer and a second material layer included in another sub-pixel of the two adjacent sub-pixels; and a second portion located on circuit wirings between light-emitting elements and pixel driving circuits included in the two adjacent sub-pixels in the same sub-pixel group;

or the second surface is the surface of the first material layer in each sub-pixel away from the light-emitting element, and in the sub-pixel group, portions, beyond a region where first light extraction layers included in the sub-pixels are located, of orthographic projections of first material layers included in the sub-pixels on a plane where the pixel layer is located surround a region where the light-emitting elements included in the sub-pixels are located; pixel driving circuits are further disposed on the substrate;

part of the black matrixes located between two adjacent sub-pixel groups are arranged in a same layer as first material layers or second material layers in the plurality of sub-pixels, or are arranged in a same layer as an entirety of first material layers and second material layers; and a remaining part of the black matrixes include: a first portion located between first material layers or second material layers included in two adjacent sub-pixels in a same sub-pixel group, or located between an entirety of a first material layer and a second material layer included in a sub-pixel and an entirety of a first material layer and a second material layer included in another sub-pixel; and a second portion located on circuit wirings between light-emitting elements and pixel driving circuits included in the two adjacent sub-pixels in the same sub-pixel group; and the second portion is disposed on a side of the light-emitting element away from the first material layer in each sub-pixel.

9. The light-emitting substrate according to claim 2, further comprising black matrixes disposed between the plurality of sub-pixels; wherein in a case where the substrate serves as the first material layer in each sub-pixel, at least part of the black matrixes are arranged in a same layer as second material layers in the plurality of sub-pixels, and are each in contact with second material layers included in two adjacent sub-pixels; or in a case where the substrate is disposed on the side of the first material layer in each sub-pixel away from the light-emitting element, at least part of the black matrixes are arranged in a same layer as an entirety of first material layers and the second material layers in the plurality of sub-pixels, and are each in contact with second material layers and first material layers included in two adjacent sub-pixels.

10. The light-emitting substrate according to claim 9, wherein in the case where the substrate serves as the first material layer in each sub-pixel, the light-emitting substrate further comprises a second light extraction layer and a light absorption pattern; the second light extraction layer and the light absorption pattern are respectively disposed at positions corresponding to a reference pattern in reference patterns, and are located on a side of the first material layer in each sub-pixel away from the reference pattern; the second light extraction layer is configured to extract light propagating in the first material layers and the second material layers in the plurality of sub-pixels in a form of total reflection toward a side of the second light extraction layer away from the first material layer in each sub-pixel; and the light absorption pattern is disposed on a side of the second light extraction layer away from the first material layer in each sub-pixel, and is in contact with the second light extraction layer, wherein the reference patterns are the at least part of the black matrixes arranged in the same layer as the second material layers in the plurality of sub-pixels.

11. The light-emitting substrate according to claim 1, wherein the first light extraction layer includes a lens structure and a grating structure disposed on a side of the lens structure away from the light-emitting element, and a surface of the grating structure away from the light-emitting element is the first surface; wherein the lens structure is configured to collimate the light emitted from the light-emitting element; and the grating structure is configured to deflect light emitted from the lens structure, so as to deflect the light emitted from the light-emitting element into the first material layer in each sub-pixel at the preset angle; or the first light extraction layer includes a lens structure and a grating structure disposed on a side of the lens structure away from the light-emitting element, and a surface of the grating structure away from the light-emitting element is the first surface; wherein the lens structure is configured to collimate the light emitted from the light-emitting element; and the grating structure is configured to deflect light emitted from the lens structure, so as to deflect the light emitted from the light-emitting element into the first material layer in each sub-pixel at the preset angle; and a refractive index of the lens structure is in a range of 1.2 to 1.4, inclusive, and an arch height of the lens structure is ⅓ times an aperture of the lens structure; and a distance between the lens structure and the grating structure is greater than or equal to 0 nm and less than or equal to 200 um.

12. The light-emitting substrate according to claim 11, wherein the grating structure is a zero-order eliminating grating, a tilted grating or a blazed grating; or the grating structure is a zero-order eliminating grating, and the grating structure has a grating constant of 410 nm and a thickness of 280 nm; or the grating structure is a tilted grating, and the grating structure bas a grating constant of 410 nm, a thickness of 450 nm and a tilt angle of 20 degrees; or the grating structure is a blazed grating, and the grating structure has a grating constant of 480 nm and a blaze angle of 35 degrees.

13. The light-emitting substrate according to claim 11, wherein the first light extraction layer further includes a transparent material layer filled between the grating structure and the lens structure, and a refractive index of the transparent material layer is in a range of 1.2 to 1.3, inclusive; and/or a duty cycle of the grating structure is in a range of 0.4 to 0.6, inclusive.

14. The light-emitting substrate according to claim 1, wherein the light-emitting substrate further comprises a filter film disposed on a side of the second material layer in each sub-pixel facing the second surface, and/or an antireflection film disposed on the side of the second material layer in each sub-pixel facing the second surface; wherein the filter film includes filter units each disposed in a sub-pixel; a filter unit in the filter units is configured to allow light with a first wavelength to pass therethrough, and to absorb light with a second wavelength; and the light with the first wavelength is light emitted from a sub-pixel where the filter unit is located, and the light with the second wavelength is light with other bands except the first wavelength in visible light bands; and/or in each sub-pixel, the second surface and a third surface are configured to reflect a reference light, so that the light deflected into the first material layer at the preset angle propagates in the first material layer and the second material layer; wherein the third surface is a surface of the second material layer away from the first material layer; and the reference light is light deflected into the first material layer at the preset angle and entering the first material layer and the second material layer during propagation.

15. A light-emitting apparatus, comprising the light-emitting substrate according to claim 1.

16. A manufacturing method of a light-emitting substrate, comprising:

forming a pixel layer; the pixel layer including a plurality of sub-pixels; wherein each sub-pixel includes a light-emitting element, a first light extraction layer disposed on a side of the light-emitting element where a light exit surface of the light-emitting element is located, a first material layer disposed on a side of the first light extraction layer where a first surface of the first light extraction layer is located, and a second material layer that is in contact with a surface of the first material layer opposite to a second surface of the first material layer; the light-emitting element is configured to emit light of a first color; the first light extraction layer is configured to deflect the light emitted from the light-emitting element into the first material layer at a preset angle; and the first material layer and the second material layer are configured to enable the light deflected at the preset angle to propagate in the first material layer and the second material layer; wherein the first surface is a surface of the first light extraction layer away from the light-emitting element; and the second surface is a surface of the first material layer proximate to or away from the light-emitting element; and the plurality of sub-pixels include at least one first sub-pixel; of a first material layer and a second material layer included in the at least one first sub-pixel, at least the second material layer includes a first light conversion material; the first light conversion material is configured to absorb light propagating in a first material layer and a second material layer included in a first reference sub-pixel, and to convert the absorbed light into emergent light of a second color; and the first reference sub-pixel is a first sub-pixel to which the first light conversion material belongs;

wherein in each sub-pixel, in a case where the second surface is the surface of the first material layer away from the light-emitting element, an area of an orthographic projection of the first material layer on a plane where the pixel layer is located is greater than an area of an orthographic projection of the first light extraction layer on the plane where the pixel layer is located, and the second material layer is disposed on a portion, beyond a region where the first light extraction layer is located, of a surface of the first material layer facing the light-emitting element; or in a case where the second surface is the surface of the first material layer proximate to the light-emitting element, an area of an orthographic projection of the first material layer on a plane where the pixel layer is located is greater than or equal to an area of an orthographic projection of the first light extraction layer on the plane where the pixel layer is located, and the second material layer is disposed on the surface of the first material layer away from the light-emitting element.

17. The manufacturing method of the light-emitting substrate according to claim 16, wherein the light-emitting substrate further includes a substrate; wherein the substrate serves as the first material layer in each sub-pixel; and forming the pixel layer, includes:

forming the first light extraction layer on the substrate;

forming the second material layer in each sub-pixel on the substrate; and forming the light-emitting element on the substrate;

or the second surface is the surface of the first material layer in each sub-pixel away from the light-emitting element; the substrate is disposed on a side of the first material layer in each sub-pixel away from the light-emitting element; and forming the pixel layer, includes:

forming the first material layer in each sub-pixel on the substrate;

forming the first light extraction layer on the substrate;

forming the second material layer in each sub-pixel on the substrate; and forming the light-emitting element on the substrate.

18. The manufacturing method of the light-emitting substrate according to claim 17, wherein pixel driving circuits are further disposed on the substrate, and the plurality of sub-pixels further include at least one second sub-pixel; the light-emitting substrate has a plurality of pixel regions; the plurality of sub-pixels constitute at least one sub-pixel group, and each sub-pixel group is located in a pixel region in the plurality of pixel regions; the sub-pixel group includes at least one first sub-pixel and at least one second sub-pixel; in the sub-pixel group, light-emitting elements included in sub-pixels are first light-emitting diodes, and have a same light-emitting color; the first light-emitting diodes include a first electrode, second electrodes, and a semiconductor layer disposed between the first electrode and the second electrodes; and the light-emitting elements included in the sub-pixels share the same first electrode; and forming the light-emitting element on the substrate, includes:

manufacturing a plurality of second light-emitting diodes; wherein each second light-emitting diode includes a plurality of first light-emitting diodes in a sub-pixel group; the plurality of first light-emitting diodes include a first electrode, second electrodes, and a semiconductor layer formed between the first electrode and the second electrodes; and the plurality of first light-emitting diodes share the same first electrode;

transferring the plurality of second light-emitting diodes onto the substrate; and electrically connecting the plurality of first light-emitting diodes included in each second light-emitting diode to respective pixel driving circuits through the first electrode and respective second electrodes.

19. The manufacturing method of the light-emitting substrate according to claim 18, wherein the first light extraction layer includes a lens structure and a grating structure disposed on a side of the lens structure away from the light-emitting element, and the light-emitting element is a first light-emitting diode; wherein forming the first light extraction layer on the substrate, includes:

forming the grating structure on the substrate;

forming the lens structure on a side of the first light-emitting diode where a light exit surface of the first light-emitting diode is located before transferring the plurality of second light-emitting diodes onto the substrate; and transferring the plurality of second light-emitting diodes and the lens structure onto the substrate synchronously;

or forming the first light extraction layer on the substrate, includes:

forming the grating structure on the substrate;

forming a transparent material layer on the substrate and in a region where the grating structure is located before transferring the plurality of second light-emitting diodes onto the substrate; and forming the lens structure on a side of the transparent material layer away from the grating structure by coining; wherein a refractive index of the transparent material layer is in a range of 1.2 to 1.3, inclusive.

* * * * *